United States Patent
Kawashima

(10) Patent No.: US 6,717,336 B2
(45) Date of Patent: Apr. 6, 2004

(54) WIDTH-EXTENSIONAL MODE PIEZOELECTRIC CRYSTAL RESONATOR

(75) Inventor: Hirofumi Kawashima, Tokyo (JP)

(73) Assignee: Piedek Technical Laboratory, Tokyo (JP)

( * ) Notice: Subject to any disclaimer, the term of this patent is extended or adjusted under 35 U.S.C. 154(b) by 0 days.

(21) Appl. No.: 10/151,824

(22) Filed: May 22, 2002

(65) Prior Publication Data

US 2003/0006679 A1 Jan. 9, 2003

(30) Foreign Application Priority Data

Jul. 6, 2001 (JP) .......................................... 2001-207016

(51) Int. Cl.[7] .............................................. H01L 41/08
(52) U.S. Cl. ....................................................... 310/367
(58) Field of Search ................................. 310/367, 368, 310/320, 348, 351; H01L 41/08

(56) References Cited

U.S. PATENT DOCUMENTS

| | | | |
|---|---|---|---|
| 3,828,210 A | * | 8/1974 | Livenick et al. ............. 310/346 |
| 4,035,674 A | * | 7/1977 | Oguchi et al. .............. 310/320 |
| 4,139,739 A | * | 2/1979 | von Meister et al. ... 379/210.01 |
| 4,216,402 A | * | 8/1980 | Engdahl ...................... 310/320 |
| 4,350,918 A | * | 9/1982 | Sato ............................ 310/367 |

OTHER PUBLICATIONS

Proceedings of The 1992 IEEE Frequency Control Symposium, "New Cuts for Width–Extensional Mode Quartz Crystal Resonators", H. Kawashima, May 27–29, 1992, pp. 525–531.
Proceedings of The 1993 IEEE International Frequency Control Symposium, "Forced Vibrations of KT–Cut Width–Extensional Mode Quartz Crystal Resonators", H. Kawashima, Jun. 2–4, 1993, pp. 527–534.

* cited by examiner

Primary Examiner—Burton S. Mullins
Assistant Examiner—Karen Addison
(74) Attorney, Agent, or Firm—Adams & Wilks

(57) ABSTRACT

A piezoelectric quartz crystal resonator has a vibrational portion, connecting portions integrally connected to respective ends of the vibrational portion, support portions integrally connected to the vibrational portion through the connecting portions, and electrodes disposed opposite each other on upper and lower surfaces of the vibrational portion. The piezoelectric quartz crystal resonator vibrates in a width-extensional mode and has a cutting angle in the range of one of xztw(−20° to +°)/(−10° to +10°) and xzwt(−10° to +10°)/(−20° to +20°).

31 Claims, 17 Drawing Sheets

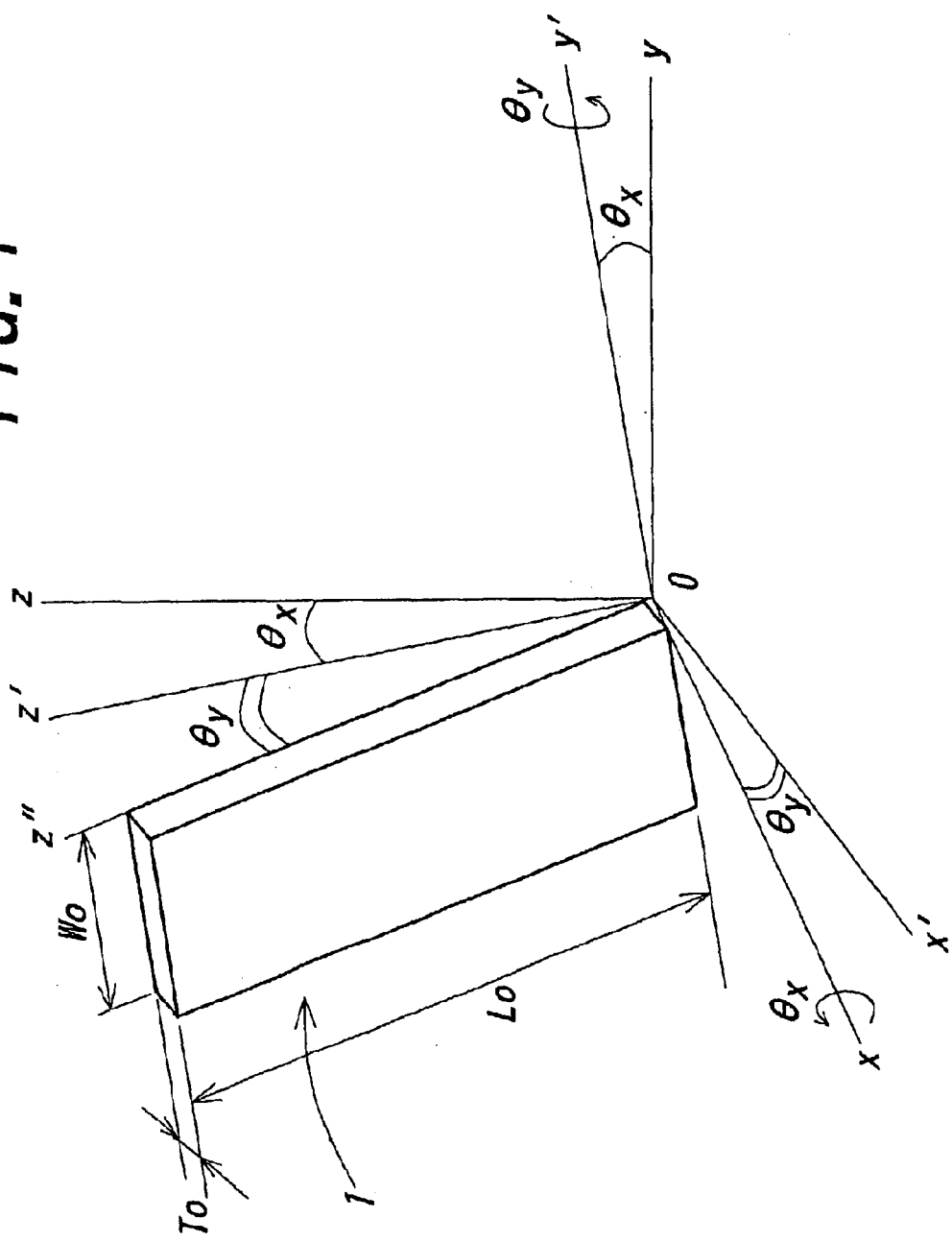

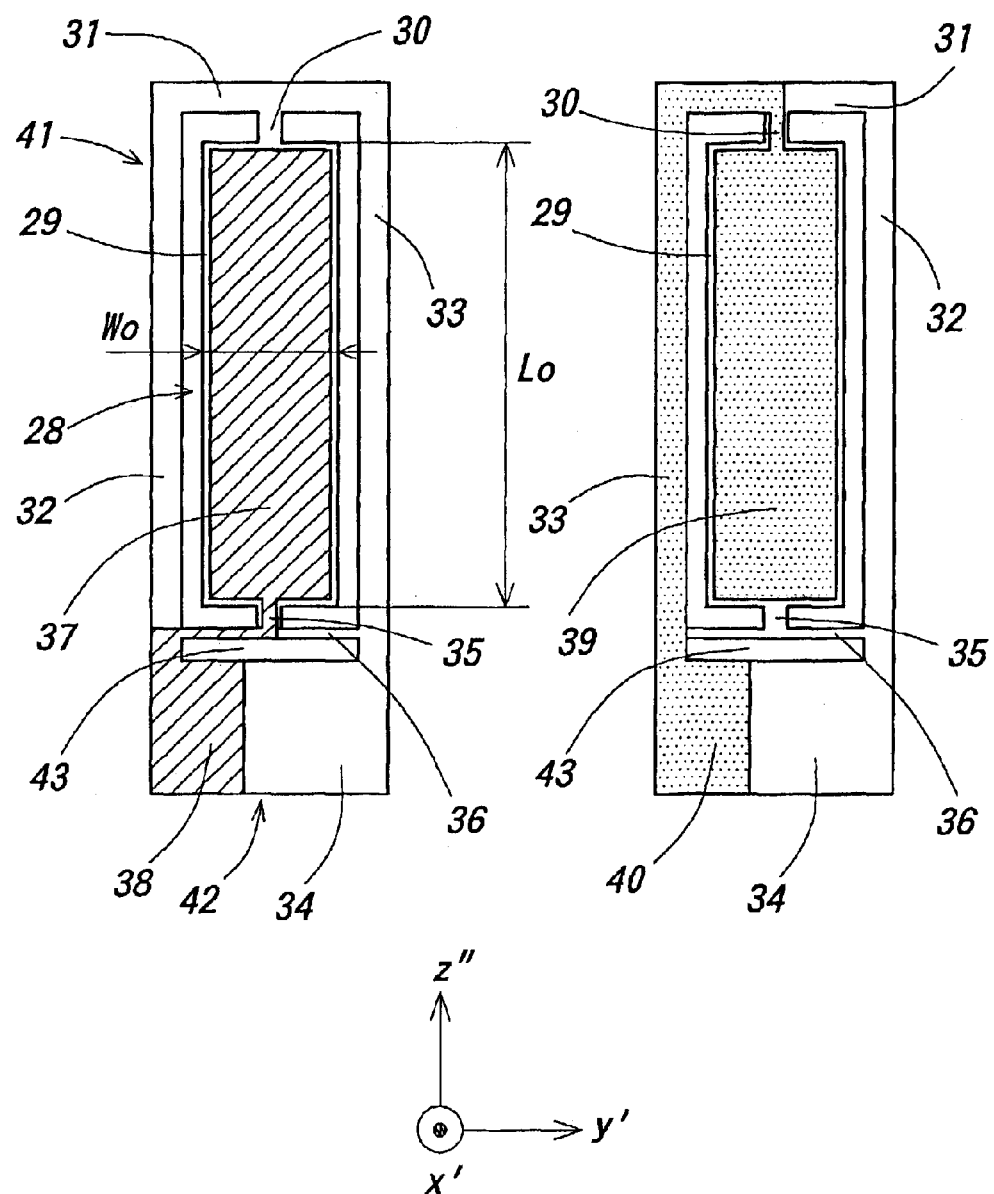

FIG. 11
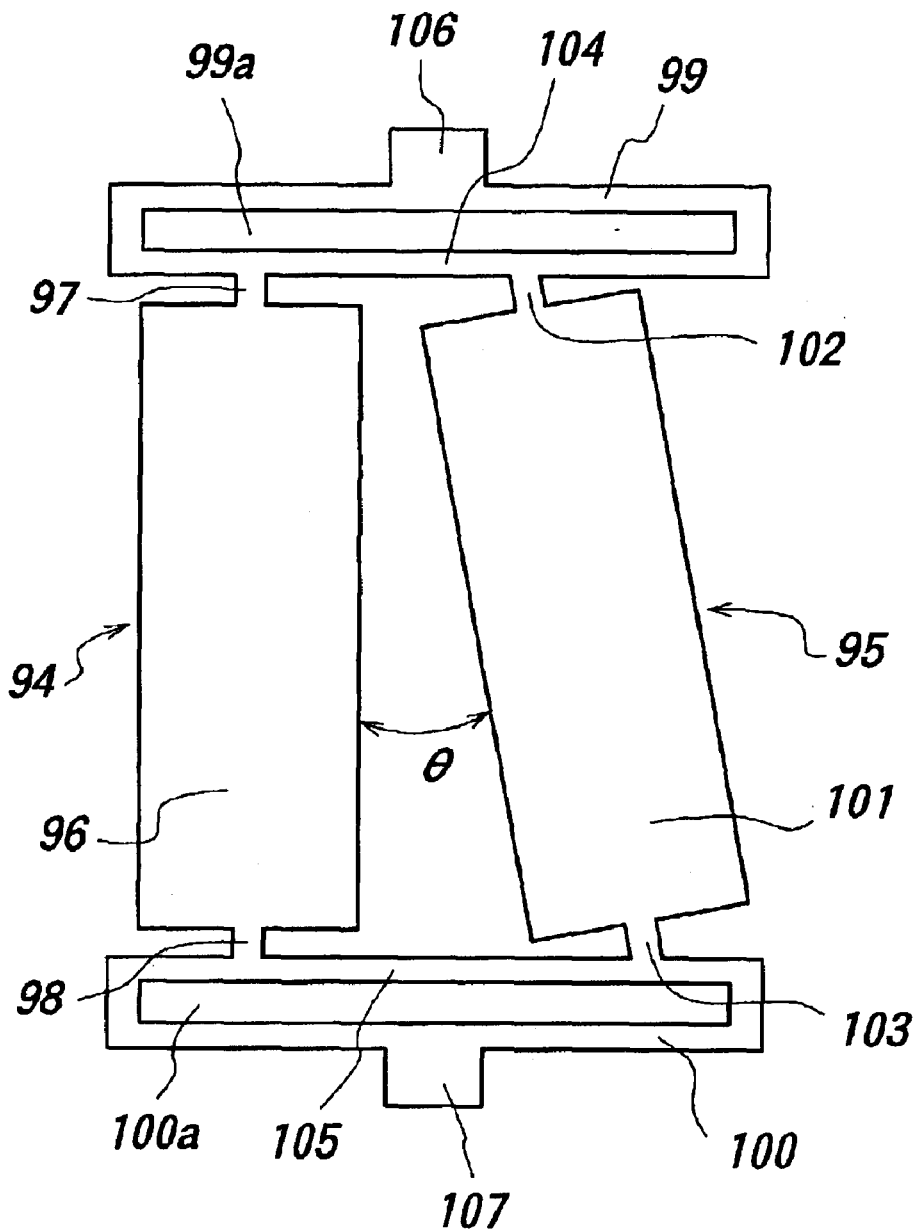
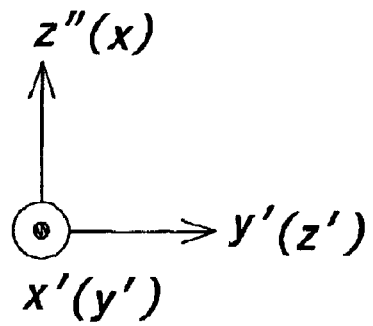

FIG. 13
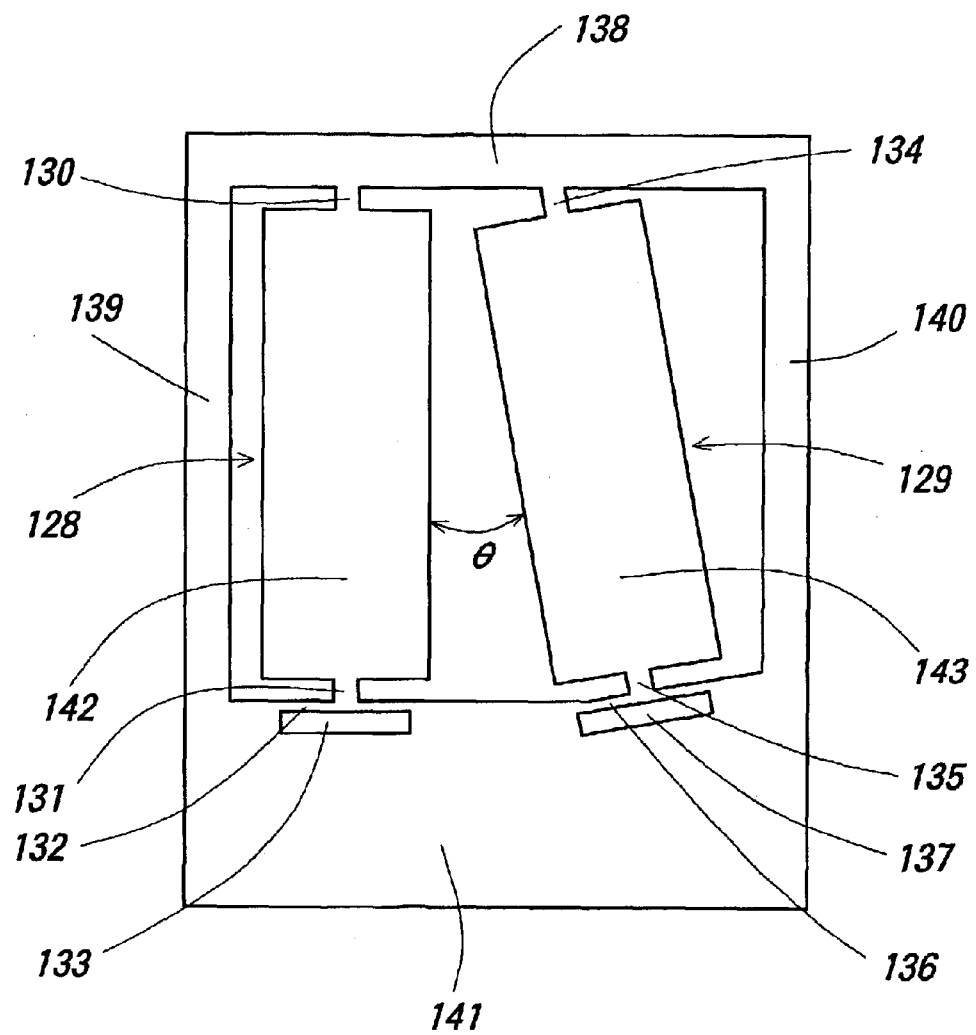
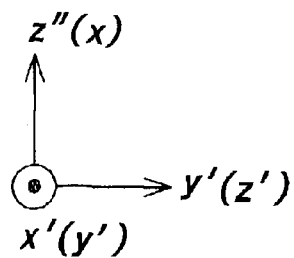

WIDTH-EXTENSIONAL MODE PIEZOELECTRIC CRYSTAL RESONATOR

FIELD OF THE INVENTION

The present invention is directed to piezoelectric crystal resonators and, more specifically, to the shape, size and cutting angle of a piezoelectric crystal resonator vibrating in a width-extensional mode.

BACKGROUND INFORMATION

Background of the Invention

A NS-GT cut coupling quartz crystal resonator which vibrates in the coupled width-extensional mode and length-extensional mode is well known and used as a time standard of consumer products and communication equipment. FIG. 17 shows a plan view of the conventional NS-GT cut coupling quartz crystal resonator. In FIG. 17, The resonator 200 comprises vibrational portion 201, connecting portions 203, 206 and supporting portions 204, 207. The supporting portions 204 and 207 include respective mounting portions 205 and 208.

In addition, as shown in FIGS. 17 and 18, electrodes 202 and 211 are disposed on the upper and lower surfaces of the vibrational portion 201, the electrode 202 extends to the mounting portion 205 through the connecting portion 203, while the electrode 211 extends to the mounting portion 208 through the connecting portion 206. The electrodes 202 and 211 have opposite electrical polarities, and two electrode terminals are constructed. Also, the resonator is mounted on lead wires or a pedestal by adhesives or solder at the mounting portions 205 and 208.

When an alternating voltage is applied between both electrodes 202 and 211, and electric field $E_t$ occurs alternately in the thickness T direction, as shown by arrow signs of the solid and broken lines in FIG. 18. As a result, the width-extensional mode and the length-extensional mode whose frequencies are inversely proportional to width W and length L of the vibrational portion, respectively, can be excited at the same time, and the NS-GT cut coupling resonator coupled in inverse phase is provided. The above-mentioned resonator is formed integratedly by a chemical etching process.

In addition, the lager the area of vibrational portion for the NS-GT cut resonator becomes (low frequency), the smaller series resistance $R_1$ becomes and the larger quality factor Q becomes. Also, the NS-GT cut resonator with excellent frequency temperature behavior is determined by a dimensional ratio W/L, and which has a value of 0.95 approximately. In order to get a higher frequency, it is necessary to decrease the area of the vibrational portion for the resonator.

Recently, according to the miniaturization and weight lightness of consumer products and communication equipment with a frequency higher than 3.5 MHz, a miniature NS-GT cut resonator with the frequency is also required with a small series resistance $R_1$ and high quality factor Q.

It is, however, impossible to provide a miniature NS-GT cut resonator with a frequency higher than about 3.5 MHz with a small series resistance $R_1$ and a high quality factor Q because the area of vibrational portion for the resonator becomes very small to get a higher frequency, and more an electro-mechanical transformation efficiency becomes small, so that series resistance $R_1$ becomes large and a quality factor Q becomes small.

It is, therefore, desirable to provide a novel and miniature quartz crystal resonator with a frequency higher than about 3.5 MHz with a small series resistance R1, a high quality factor Q and excellent frequency temperature behavior over a wide temperature range.

SUMMARY OF THE INVENTION

The present invention relates to a width-extensional mode piezoelectric crystal resonator vibrating in the single mode with a high electro-mechanical transformation efficiency and relates to cut angle, electrode construction and resonator shape thereof.

In particular, the present invention relates to the width-extensional mode piezoelectric crystal resonator with a new cut angle and new electrode construction which is available for wearable equipment, communication equipment, measurement apparatus and consumer products employing quartz crystal or lithium tantalate ($LiTaO_3$) or lithium niobate ($LiNbO_3$) as a piezoelectric material and requiring miniaturization, high accuracy, shock-proof and low prices for the crystal resonator.

It is an object of the present invention to provide a width-extensional mode piezoelectric crystal resonator with a high electro-mechanical transformation efficiency.

It is an another object of the present invention to provide a miniature width-extensional mode piezoelectric crystal resonator with a frequency higher than about 3.5 MHz with a small series resistance $R_1$ and a high quality factor Q.

It is a further object of the present invention to provide a width-extensional mode piezoelectric crystal resonator with good frequency temperature behavior over a wide temperature range.

In order to accomplish a miniature width-extensional mode piezoelectric crystal resonator with a frequency higher than about 3.5 MHz with a high electro-mechanical transformation efficiency which gives a small series resistance R1 and a high quality factor Q, it is necessary to provide a width-extensional mode piezoelectric crystal resonator which is formed from a piezoelectric crystal plate with the new cut angle, the new electrode construction and a large piezoelectric constant.

In accordance with the present invention, this is accomplished by new cut angle and having new electrode construction and a large piezoelectric constant.

In full detail, such a resonator is formed in accordance with the present invention, from a piezoelectric crystal plate of new cut angle.

Moreover, such a resonator is provided in accordance with the present invention, by new electrode construction and large piezoelectric constants.

In addition, in accordance with the present invention, an improvement of frequency temperature behavior for a width-extensional mode piezoelectric crystal resonator is accomplished at least by two resonators connected and formed integratedly through frame or supporting frame. The crystal resonators with each different turn over temperature point Tp are electrically connected in parallel. As a result of which, the integratedly formed crystal resonator of the present invention has good frequency temperature behavior over a wide temperature range.

The present invention will be more fully understood by referring to the following detailed specification and claims taken in connection with the appended drawings.

BRIEF DESCRIPTION OF THE DRAWINGS

FIG. 1 is a general view of piezoelectric crystal plate from which a width-extensional mode piezoelectric crystal resonator of the present invention is formed, particularly, a relationship of cut angle of quartz crystal plate and its coordinate system;

FIG. 4 is a plan view (a) and a bottom view (b) for width-extensional mode quartz crystal resonator of the third embodiment and width-extensional mode lithium tantalate and lithium niobate resonators of the fourth embodiment, according to the present invention;

FIG. 11 is a plan view illustrating a shape of width-extensional mode piezoelectric crystal resonators of the eighth embodiment, according to the present invention;

FIG. 13 is a plan view illustrating a shape of width-extensional mode piezoelectric crystal resonators of the tenth embodiment, according to the present invention;

DETAILED DESCRIPTION OF THE PREFERRED EMBODIMENTS

Figures 2A, 2B:
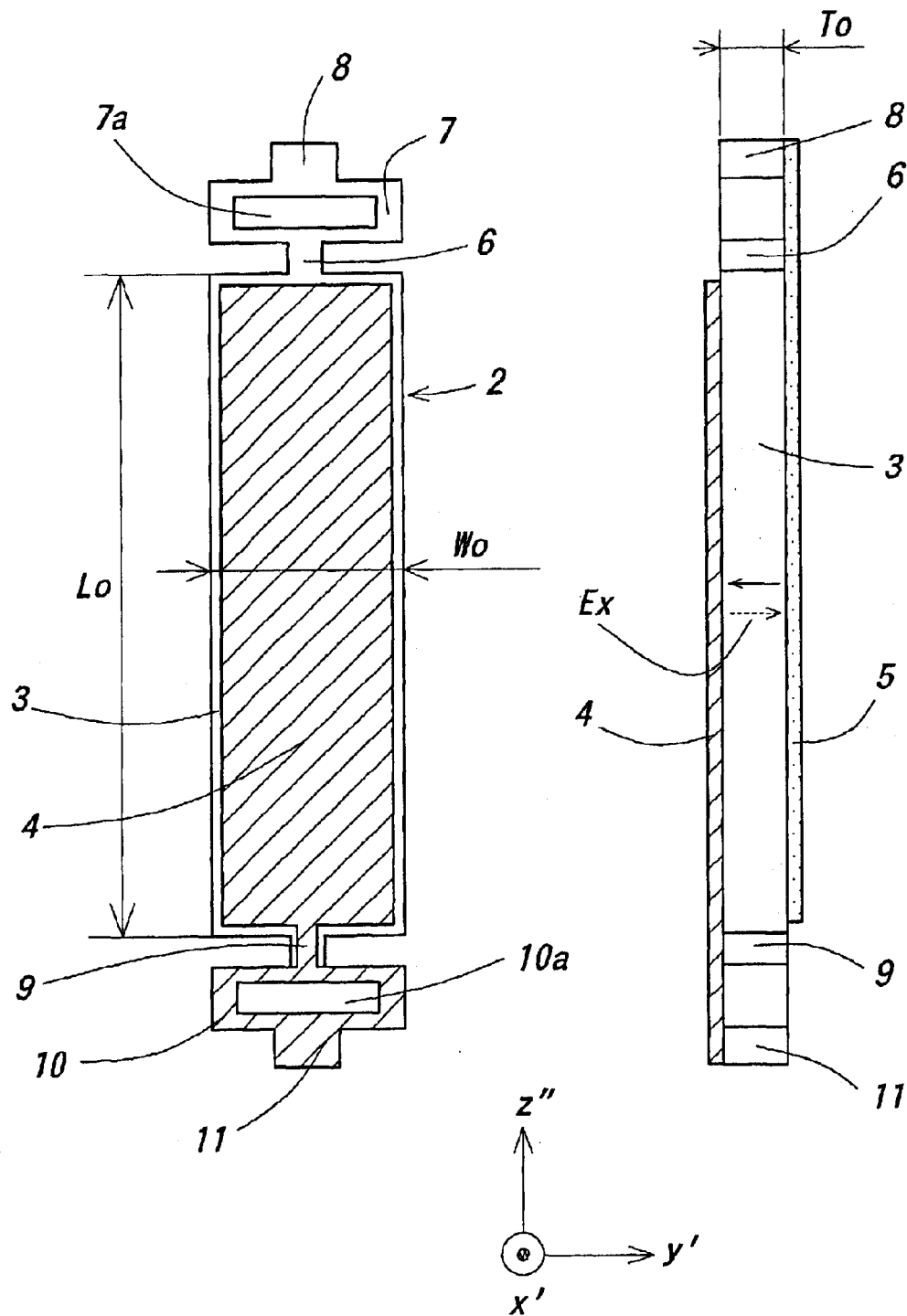
FIG. 2 is a plan view (a) and a side view (b) for a width-extensional mode quartz crystal resonator of the first embodiment, and width-extensional mode lithium tantalate and lithium niobate resonators of the fourth embodiment, according to the present invention.

Referring now to the drawings, the embodiments of the present invention will be described in full detail.

First Embodiment

FIG. 1 is a general view of a piezoelectric crystal plate from which a width-extensional mode piezoelectric crystal resonator of the present invention is formed, particularly, a relationship of a cut angle of a quartz crystal plate 1 and its coordinate system. The coordinate system has original point O, electrical axis x, mechanical axis y and optical axis z, and O-xyz is constructed.

First, a quartz crystal plate perpendicular to x axis, so called, X plate quartz crystal is taken. Width $W_0$, length $L_0$ and thickness $T_0$ which are each dimension of the X plate quartz crystal correspond to the respective directions of y, z and x axes.

Next, this X plate quartz crystal is, first, rotated with an angle $\theta_x$ of $-20°$ to $+20°$ about the x axis, and second, rotated with an angle $\theta_y$ of $-10°$ to $+10°$ about y' axis which is the new axis of the y axis. In this case, the new axis of the x axis changes to x' axis and the new axis of the z axis changes to z' axis because the z axis is rotated twice about two axes. The width-extensional mode quartz crystal resonator of the present invention is formed from said quartz crystal plate with the rotation angles.

In this embodiment, though the X plate quartz crystal is, first, rotated with the angle $\theta_x$ about the x axis, and second, rotated with the angle $\theta_y$ about the y' axis, embodiment of the present invention may change the rotation order of the angles $\theta_x$ and $\theta_y$. Namely, the X plate is, first, rotated with $\theta_y$ about the y axis, and second, rotated with $\theta_x$ about the x' axis.

FIG. 2 is a plan view (a) and a side view (b) for a width-extensional mode quartz crystal resonator of the first embodiment of the present invention. The resonator 2 comprises vibrational portion 3, connecting portions 6, 9 and supporting portions 7, 10 including respective mounting portions 8, 11. In addition, the supporting portions 7 and 10 have respective holes 7a and 10a. Electrodes 4 and 5 are disposed on opposite upper and lower surfaces of the vibrational portion 3, and have opposite electrical polarities. Namely, a pair of electrodes are disposed on the vibrational portion 3.

In addition, the electrode 4 extends to the mounting portion 11 through the one connecting portion 9 and the electrode 5 extends to the mounting portion 8 through the other connecting portion 6. In this embodiment, the electrodes 4 and 5 disposed on the vibrational portion 3 extend to the mounting portions in different directions to each other. However, a resonator with the same characteristics as said resonator can be obtained, even if the electrodes 4 and 5 extend to the mounting portions in the same direction to each other. The resonator in this embodiment is mounted on a pedestal at the mounting portions 8 and 11 by adhesives or solder.

Moreover, the vibrational portion 3 has a dimension of width $W_0$, length $L_0$ and thickness $Z_0$, also, width $W_0$, length $L_0$ and thickness $T_0$ correspond to y', z" and x' axes, respectively. That is, the electrodes 4 and 5 are disposed on the upper and lower surfaces of the vibrational portion 3 perpendicular to the x' axis.

In addition, the vibrational portion 3 has a dimension of length $L_0$ greater than width $W_0$, and thickness $T_0$ smaller than width $W_0$. Namely, a coupling between width-extensional mode and length-extensional mode gets as small as it can be ignored, as a result of which, the quartz crystal resonator can vibrate in a single width-extensional mode, and also, a width-to-length ratio $W_0/L_0$ has a value smaller than 0.7 to provide the resonator with a small series resistance $R_1$ by increasing electrode area of the vibrational portion. In addition, a thickness-to-width ratio $T_0/W_0$ has a value smaller than 0.85 to provide the resonator with a small $R_1$ by increasing the intensity of an electric field $E_x$. These actual dimensions are, therefore, determined by the requirement characteristics for the width-extensional mode quartz crystal resonator.

In full detail, resonance frequency of the width-extensional mode quartz crystal resonator is inversely proportional to width $W_0$, and it is almost independent on such an other dimension as length $L_0$, thickness $T_0$, connecting portions and supporting potions. Therefore, a miniature width-extensional mode quartz crystal resonator is provided with high frequency. Also, the resonator vibrating in a single width-extensional mode can be obtained from the relation of said dimensions.

Next, a value of piezoelectric constant $e_{12}$ is described, which is of great importance and necessary to excite a width-extensional mode quartz crystal resonator in this embodiment. The larger a value of this piezoelectric constant $e_{12}$ becomes, the higher an electromechanical transformation efficiency becomes. The piezoelectric constant $e_{12}$ has an absolute value of 0.123 C/m² to 0.18 C/m², when the angle $\theta_x$ has a value of −20° to +20° and the angle $\theta_y$ has a value of −10° to +10°. This value is markedly large as compared with the piezoelectric constant $e_{21}$ of 0.1 C/m² by which the conventional NS-GT cut quartz crystal resonator can be excited.

In other words, as the quartz crystal resonator in this embodiment has a high electro-mechanical transformation efficiency, the miniature resonator can be provided with a small series resistance $R_1$ and a high quality factor Q.

Now, when an alternating voltage is applied between the electrodes 4 and 5 shown in FIG. 2, an electric field $E_x$ occurs alternately in the thickness direction, as shown by the arrow direction of the solid and broken lines in FIG. 2. Consequently, the vibrational portion 3 extends and contracts in the width direction.

Second Embodiment

Figures 3A, 3B:
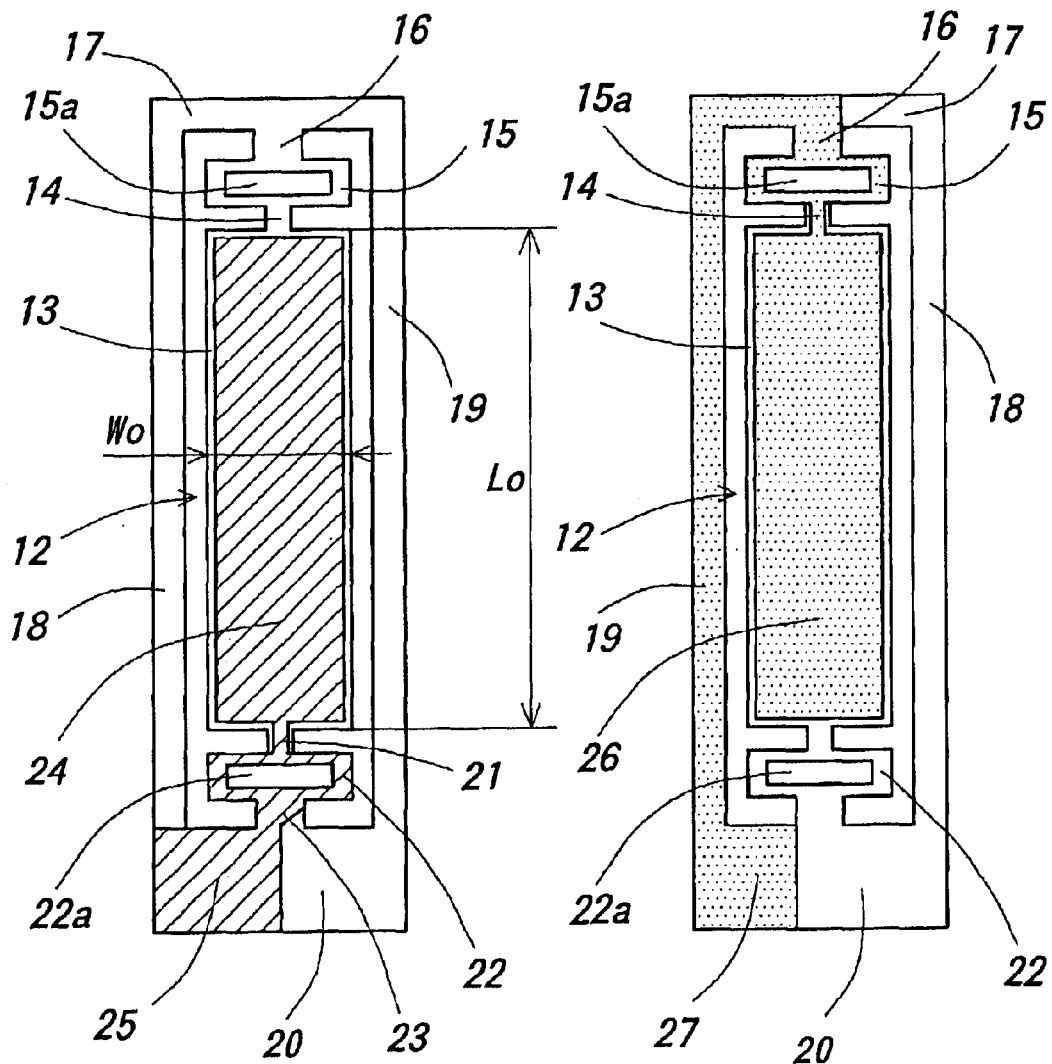
FIG. 3 is a plan view (a) and a bottom view (b) for a width-extensional mode quartz crystal resonator of the second embodiment, and width-extensional mode lithium tantalate and lithium niobate resonators of the fourth embodiment, according to the present invention.

FIG. 3 is a plan view (a) and a bottom view (b) for a width-extensional mode quartz crystal resonator of the second embodiment of the present invention. The resonator 12 comprises vibrational portion 13, connecting portions 14, 21, supporting portion 15 including mounting portion 16, supporting frame 17 connected to the mounting portion 16 and supporting frames 18, 19, and supporting portion 22 including mounting portion 23 and mounting portion 20 connected to the mounting portion 23.

In addition, both end portions of the supporting frame 17 are connected to the one end portion of the supporting frames 18, 19 and the other end portion of the frames 18, 19 is connected to the mounting portion 20. The supporting portions 15 and 22 have respective holes 15a and 22a.

Electrodes 24 and 26 are disposed on opposite upper and lower surfaces of the vibrational portion 13 and have opposite electrical polarities. The electrode 24 extends to the mounting portion 20 through the one connecting portion 21, and another electrode 25 which forms an electrode terminal is constructed on the mounting portion 20. The electrode 26 also extends to the mounting portion 20 through the other connecting portion 14 and the supporting frames 17, 19, and another electrode 27 which forms an electrode terminal is constructed on the mounting portion 20. Namely, two electrode terminals are constructed.

In this embodiment, though only the electrodes of the vibrational portion are disposed opposite thereto, the electrodes on the other portions such as the supporting frames can also be disposed opposite one another because the influence to series resistance $R_1$ thereby is small and can be ignored.

In addition, the vibrational portion 13 has a dimension of width $W_0$, length $L_0$ and thickness $T_0$ (not visible in FIG. 3), and also width $W_0$, length $L_0$ and thickness $T_0$ correspond to the respective directions of y', z" and x' axes. Namely, the electrodes 24 and 26 are disposed upon the upper and lower surfaces of the vibrational portion 13 perpendicular to x' axis. Also, the electrodes 24 and 26 have opposite electrical polarities. The vibrational portion 13 has a dimension of length $L_0$ greater than width $W_0$ and thickness $T_0$ smaller than width $W_0$. The concrete relationship of the dimensions is the same as that already described in detail in the first embodiment.

By forming the width-extensional mode quartz crystal resonator like this, the resonator with mechanical strength is provided, so that a manufacturing process excellent in mass production can be taken because it can be mounted at the one end portion thereof on a pedestal or lead wires by adhesives or solder. That is, the low priced resonator can be realized, and simultaneously, it can be obtained which is strong against shock.

Moreover, as the supporting portions have the respective holes, a width-extensional mode easily occurs piezoelectrically, as a result, the miniature width-extensional mode quartz crystal resonator can be provided with a small series resistance $R_1$ and a high quality factor Q.

In this embodiment, though the electrodes 25 and 27 with opposite electrical polarities are disposed on the upper surface and the lower surface of the mounting portion 20, an embodiment of the present invention also includes the electrode construction for a resonator with opposite electrical polarities on the same plane of the mounting portion 20. For example, the electrodes disposed opposite on the upper and lower surfaces of the mounting portion are connected so that they have the same electrical polarities through an electrode disposed on the side of the supporting frame or the side of the mounting portion. In addition, the resonator in this embodiment has two supporting frames in parallel to the vibrational portion. The present invention also includes a resonator with one supporting frame because it has sufficient mechanical strength and good electrical characteristics.

Third Embodiment

FIG. 4 is a plan view (a) and a bottom view (b) for a width-extensional mode quartz crystal resonator of the third embodiment of the present invention. The resonator 28 comprises vibrational portion 29, connecting portions 30, 35 supporting portion 41 including supporting frames 31, 32, 33, and supporting portion 42 including supporting frame 36 and mounting portion 34.

In addition, the vibrational portion 29 is connected to the supporting frame 31 through the one connecting portion 30, both end portions of the supporting frame 31 are connected to the supporting frames 32 and 33. Similarly, the vibrational portion 29 is also connected to the supporting frame 36 through the other connecting portion 35, both end portions of the frame 36 are connected to the supporting frames 32 and 33. Also, the mounting portion 34 has a hole 43 and by constructing the hole, a width-extensional mode occurs easily without the suppression of vibration.

Moreover, the electrodes 37 and 39 disposed on the upper and lower surfaces of the vibrational portion 29 have opposite electrical polarities. The electrode 37 extends to the mounting portion 34 through the one connecting portion 35, the electrode 38 of the one electrode terminal is constructed on the mounting portion 34. Similarly, the electrode 39 extends to the mounting portion 34 through the other connecting portion 30 and the supporting frames 31, 33, the electrode 40 of the other electrode terminal is constructed on the mounting portion 34. Namely, two electrode terminals are constructed. The present invention also includes the other method of electrode construction and the supporting frame which are the same as those described in the second embodiment.

In addition, the vibrational portion 29 has a dimension of width $W_0$, length $L_0$ and thickness $T_0$ (not visible in FIG. 4), and a relationship between the dimension and x', y' and z'' axes is the same as that described in the first embodiment. Also, the vibrational portion 29 has a dimension of length $L_0$ greater than width $W_0$ and thickness $T_0$ smaller than width $W_0$, the concrete relationship is the same as that described in the first embodiment. The vibrational portion, the connecting portions and the supporting portion for the width-extensional mode resonator in said embodiment are formed integratedly.

By forming the width-extensional mode quartz crystal resonator as described above the low priced resonator is obtained because it is excellent in mass production, as already described in detail in the second embodiment. Simultaneously, the width-extensional mode resonator with shock-proof can be realized. Then, as the hole is constructed at the mounting portion, a width-extensional mode easily occurs piezoelectrically without the suppression of vibration, so that a miniature width-extensional mode quartz crystal resonator can be provided with a small series resistance R1 and a high quality factor Q.

Figure 5:
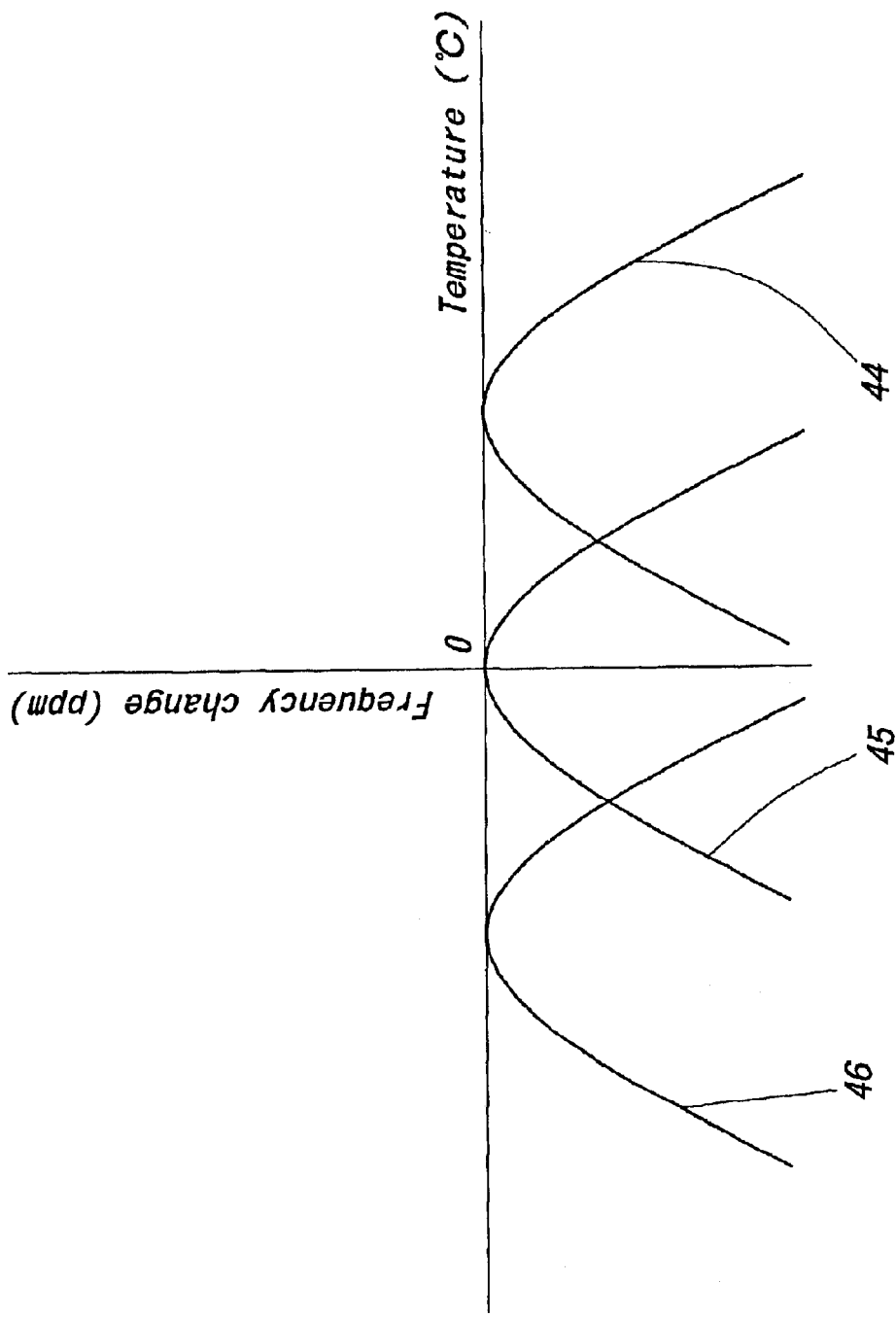
FIG. 5 is an example of frequency temperature behavior for the width-extensional mode quartz crystal resonators of the first embodiment to the third embodiment, according to the present invention.

FIG. 5 is an example of frequency temperature behavior for the width-extensional mode quartz crystal resonators of the first embodiment to the third embodiment. The first order temperature coefficient α becomes zero at arbitrary temperature by the selection of said angles $\theta_x$ and $\theta_y$ and the quartz crystal resonators have a parabolic curve.

For example, a turn over temperature point $T_p$ can be set up in the vicinity of room temperature, as shown by the curve 44. The curve 45 has also a turn over temperature point $T_p$ in vicinity of 0° C., and the curve 46 has $T_p$ at minus temperature. $T_p$ can be set up over a very wide temperature range of approximately −200° C. to approximately +60° C. for the width-extensional mode quartz crystal resonators with the angle $\theta_x$ and $\theta_y$ in said embodiments. The $T_p$ for the resonator is, therefore, required and determined by such goods as consumer products, communication equipment and so forth.

Thus, as the turn over temperature point $T_p$ for the width-extensional mode quartz crystal resonator of the present invention can be set up arbitrarily over a very wide temperature range and the frequency temperature behavior has the parabolic curve, it is easily understood that the resonator can be provided with a small frequency change over a wide temperature range, namely, with the excellent frequency temperature behavior.

Fourth Embodiment

Figure 6:
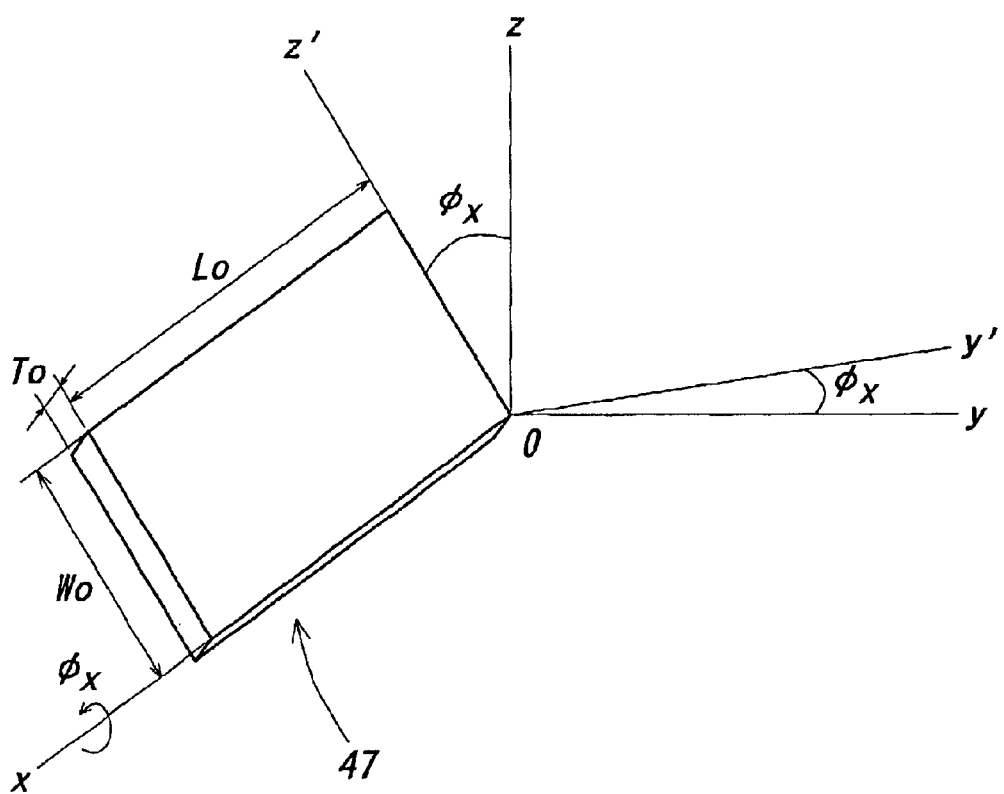
FIG. 6 is a general view of piezoelectric crystal plate from which a width-extensional mode piezoelectric crystal resonator of the present invention is formed, particularly, a relationship of cut angle of lithium tantalate plate or lithium niobate plate and its coordinate system.

FIG. 6 is a general view of piezoelectric crystal plate from which a width-extensional mode piezoelectric crystal resonator of the present invention is formed, particularly, a relationship of cut angle of lithium tantalate plate 47 or lithium niobate plate 47 and its coordinate system. The coordinate system has original point O, electrical axis x, mechanical axis y and optical axis z, and O-xyz is constructed.

First, a crystal plate perpendicular to y axis, so called, Y plate lithium tantalate and Y plate lithium niobate are taken. Width $W_0$, length $L_0$ and thickness $T_0$ which are each dimension of the Y plates correspond to the direction of z, x and y axes, respectively.

Next, these Y plates are rotated with angle $\phi_x$ of +110° to +150° about the x axis. The new axis of y and z axes, therefore, correspond to y' and z' axes, respectively, width-extensional mode lithium tantalate and lithium niobate resonators are formed from said rotated piezoelectric crystal plates.

In addition, resonator shape, electrode construction and so forth for width-extensional mode lithium tantalate and lithium niobate resonators of the fourth embodiment of the present invention are the same as those of FIGS. 2, 3 and 4 shown by the first embodiment to the third embodiment. In full detail, the lithium tantalate and lithium niobate resonators are obtained by replacing quartz crystal with lithium tantalate or lithium niobate, then, by replacing x', y' and z'' axes of quartz crystal with y', z' and x axes of lithium tantalate or lithium niobate because the coordinate systems are different and by replacing electric field $E_x$ with electric field $E_y$.

Figure 7:
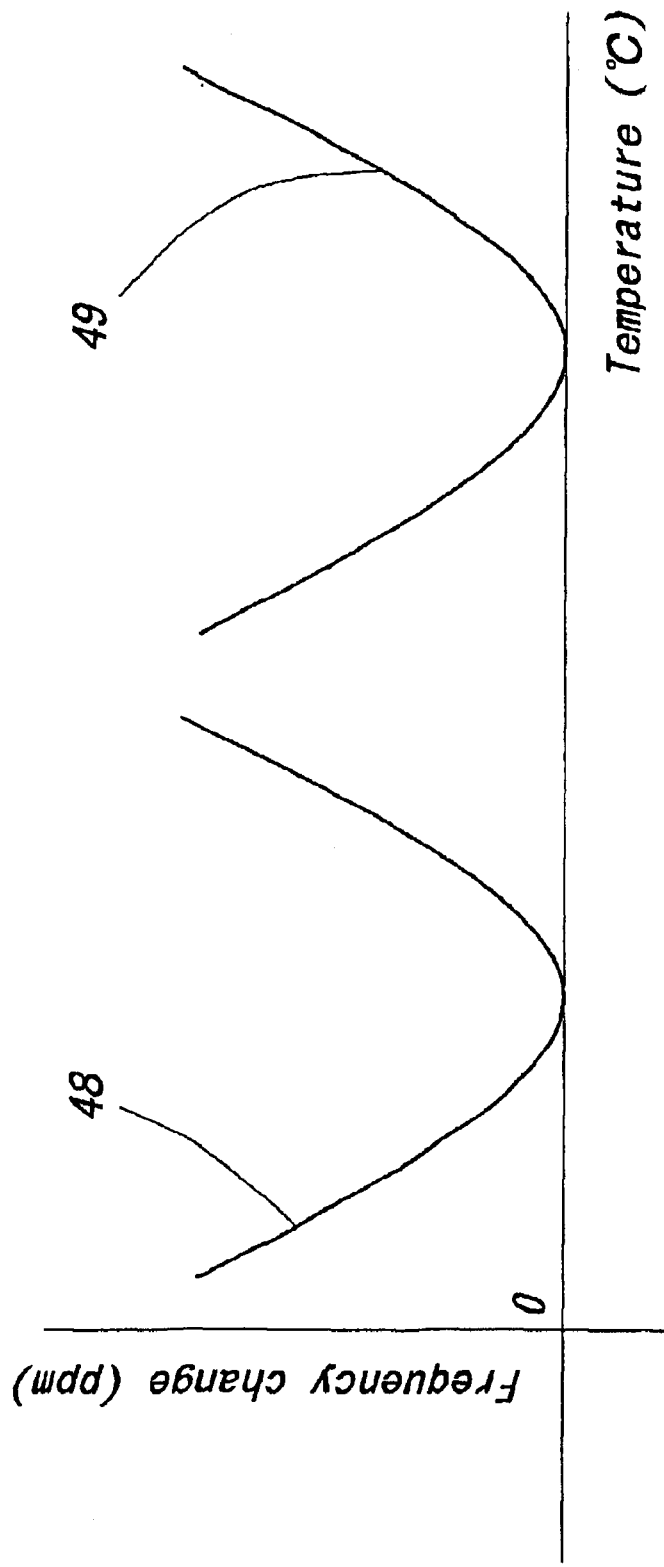
FIG. 7 is an example of frequency temperature behavior for width-extensional mode lithium tantalate resonators of the fourth embodiment, according to the present invention.

FIG. 7 is an example of frequency temperature behavior for the lithium tantalate resonators in the fourth embodiment. $T_p$ can be changed by choosing the angle $\phi_x$. For example, $T_p$ has approximately 40° C. for the curve 48, then, the curve 49 has $T_p$ higher than 40° C. and it is also possible to get $T_p$ higher than 100° C.

Thus, as the frequency temperature behavior for the lithium tantalate resonator has a parabolic curve, it can be obtained with a small frequency change over a wide temperature range, namely with the excellent frequency temperature behavior.

Next, a value of piezoelectric constant $e_{23}$ is described, which is very important and necessary to excite the lithium tantalate and lithium niobate resonators in this embodiment. When angle $\phi_x$ has a value of +110° to +150°, an absolute value of piezoelectric constant $e_{23}$ for the lithium tantalate resonator has a value of 1.30 C/m$^2$ to 2.28 C/m$^2$, the absolute value of $e_{23}$ is extremely large as compared with that of $e_{12}$ for the quartz crystal resonator. Also, for the lithium niobate resonator with the angle $\phi_x$, the absolute value of $e_{23}$ has a value of 1.22 C/m$^2$ to 3.04 C/m$^2$, the value becomes large similar to that of lithium tantalate resonator.

That is, as the width-extensional mode lithium tantalate and lithium niobate resonators of the present invention have a very high electro-mechanical transformation efficiency, the miniature lithium tantalate and lithium niobate resonators can be provided with a very small series resistance $R_1$ and a high quality factor Q.

Fifth Embodiment

Figures 8A, 8B:
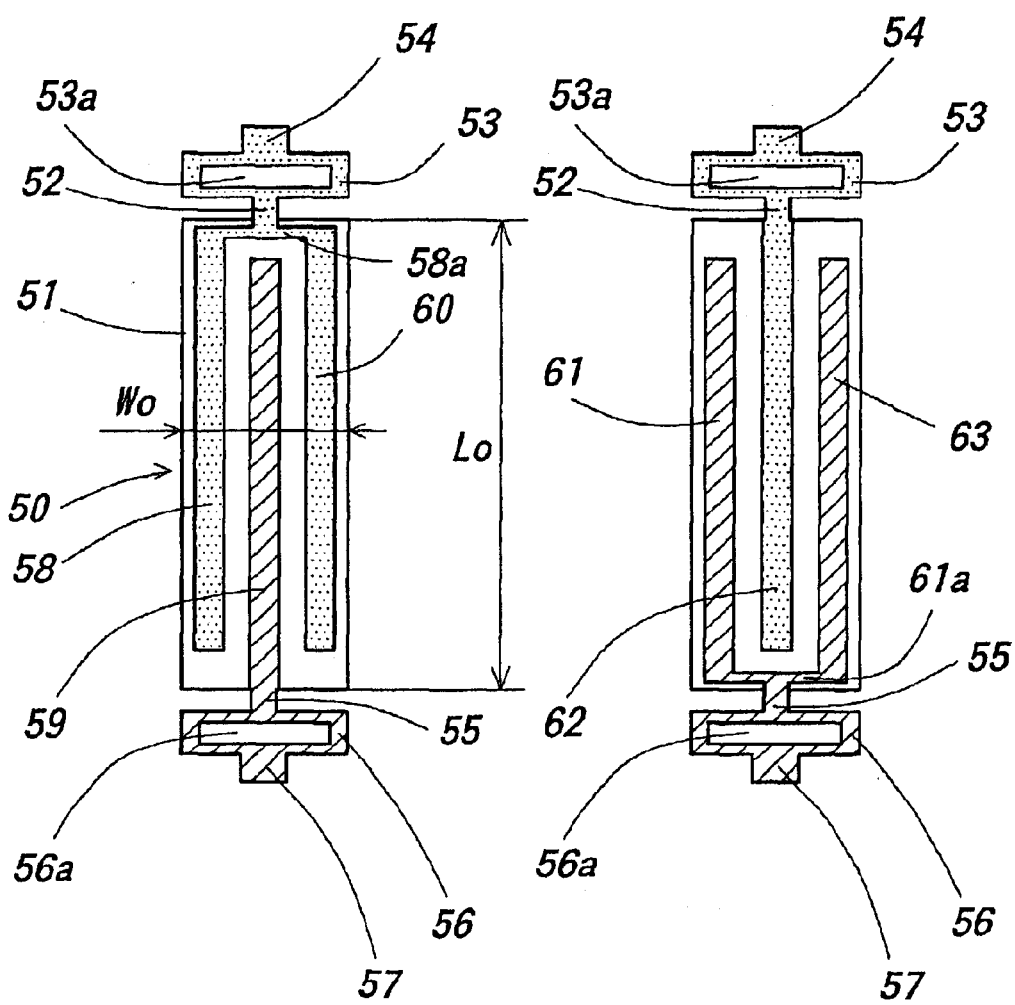
FIG. 8 is a plan view (a) and a bottom view (b) for the width-extensional mode quartz crystal resonator of the fifth embodiment, according to the present invention.

FIG. 8 is a plan view (a) and a bottom view (b) for a width-extensional mode quartz crystal resonator of the fifth embodiment of the present invention. The resonator 50 comprises vibrational portion 51, connecting portions 52, 55 and supporting portions 53, 56 including respective mounting portions 54, 57.

In addition, the supporting portions 53 and 56 have respective holes 53a and 56a, and a plurality of electrodes are disposed on the upper and lower surfaces of the vibrational portion 51, respectively. Also, electrodes adjoining in the width direction of the upper and lower surfaces have opposite electrical polarities. Moreover, the electrodes disposed opposite to the upper and lower surfaces have opposite electrical polarities. In this embodiment, the electrodes 58, 59 and 60 are disposed on the upper surface and the electrodes 61, 62 and 63 are disposed on the lower surface. The width-extensional mode quartz crystal resonator of the third overtone can be provided by the electrode construction in this embodiment.

In full detail, the electrode 58 and the electrode 59 adjoining thereto have opposite electrical polarities. In addition, the electrode 58 and the electrode 63 disposed opposite thereto have also opposite electrical polarities. A pair of electrode is, therefore, constructed by the electrode 58 and the electrode 63.

Similarly, the electrode 59 and the electrodes 58, 60 adjoining thereto have opposite electrical polarities, the electrode 59 and the electrode 62 disposed opposite thereto have also opposite electrical polarities. A pair of electrode is, therefore, constructed by the electrodes 59 and 62. Moreover, the electrode 60 and the electrode 59 adjoining thereto have opposite electrical polarities, and the electrode 60 and the electrode 61 disposed opposite thereto have also opposite electrical polarities. A pair of electrode is, therefore, constructed by the electrodes 60 and 61.

Also, the electrodes 58 and 60 of the upper surface are connected through connecting electrode 58a, while the electrodes 61 and 63 of the lower surface are connected through connecting electrode 61a. In addition, the electrodes 58 and 60 of the upper surface with the same electrical polarity extend to the mounting portion 54 through the one connecting portion 52 and the electrode 59 extends to the mounting portion 57 through the other connecting portion 55.

Similarly, the electrode 62 of the lower surface extends to the mounting portion 54 through the one connecting portion 52 and the electrodes 61 and 63 of the lower surface with the same electrical polarity extend to the mounting portion 57 through the other connecting portion 55. As is apparent from FIG. 8, the electrodes are disposed with the same electrical polarity extended from the vibrational portion to the upper and lower surfaces of the one connecting portion and the supporting portion and similarly, the electrodes having opposite electrical polarity to said electrodes are disposed with the same electrical polarity extended from the vibrational portion to the upper and lower surfaces of the other connecting portion and the supporting portion.

Accordingly, the one electrodes 58, 60 and 62 have the same electrical polarity, while the other electrodes 59, 61 and 63 having the opposite electrical polarity thereto have the same electrical polarity. Two electrode terminals are constructed. In this embodiment, three pairs of electrode are disposed. The electrode construction of the present invention is not limited to said embodiment. The present invention also includes the electrode construction of n pairs of electrode (n=5, 7, 9 . . . ), namely, odd pairs of electrode for a width-extensional mode quartz crystal resonator vibrating in symmetry mode and also, m pairs of electrode (m=2, 4, 6 . . . ), namely, even pairs of electrode for a width-extensional mode quartz crystal resonator vibrating in asymmetry mode.

Next, a relationship of width $W_0$, length $L_0$, thickness $T_0$ of the vibrational portion and the electrode is described in detail. Three pairs of electrode are disposed in this embodiment. In order to provide the width-extensional mode quartz crystal resonator with good frequency temperature behavior shown in FIG. 5 and a small series resistance $R_1$, the thickness-to-width ratio ($T_0/W_0$) may need a value smaller than 0.283, as the intensity of electric field $E_x$ increases. In addition, to avoid the coupling between width-extensional and length-extensional modes and to provide the quartz crystal resonator with a small series resistance $R_1$ by increasing electrode area of the vibrational portion, the width-to-length ratio ($W_0/L_0$) may need a value smaller than 0.21.

As described above, though three pairs of electrode are constructed on the vibrational portion in this embodiment, a nth overtone width-extensional mode quartz crystal resonator can be provided by constructing n pairs of electrode (n=5, 7, 9 . . . ), namely, the odd pairs. In this case, to provide the quartz crystal resonator with said excellent characteristics, the thickness-to-width ratio ($T_0/W_0$) and the width-to-length ratio ($W_0/L_0$) may need values smaller than 0.85/n and 0.7 n, respectively. Similarly, the thickness-to-width ratio and the width-to-length ratio may need values smaller than 0.85/m and 0.7 m for the resonator with m pairs of electrode (m=2, 4, 6 . . . ), namely, even pairs of electrode.

Thus, from the embodiments of the present invention, it is easily understood that the miniature width-extensional mode quartz crystal resonator of high-order overtone can be realized with a small series resistance $R_1$ and excellent frequency temperature behavior, especially, by devising the means of electrode construction of the vibrational portion. As resonant frequency of the width-extensional mode resonator is proportional to the order of overtone, the resonator is provided with high frequency.

Moreover, the electrode construction described in detail in this embodiment is also applicable to the resonators of FIGS. 3 and 4. So far, though the explanation was performed by quartz crystal as a piezoelectric material, a resonator can be also obtained with good electrical characteristics by replacing quartz crystal with lithium tantalate or lithium niobate.

Sixth Embodiment

Figure 9:
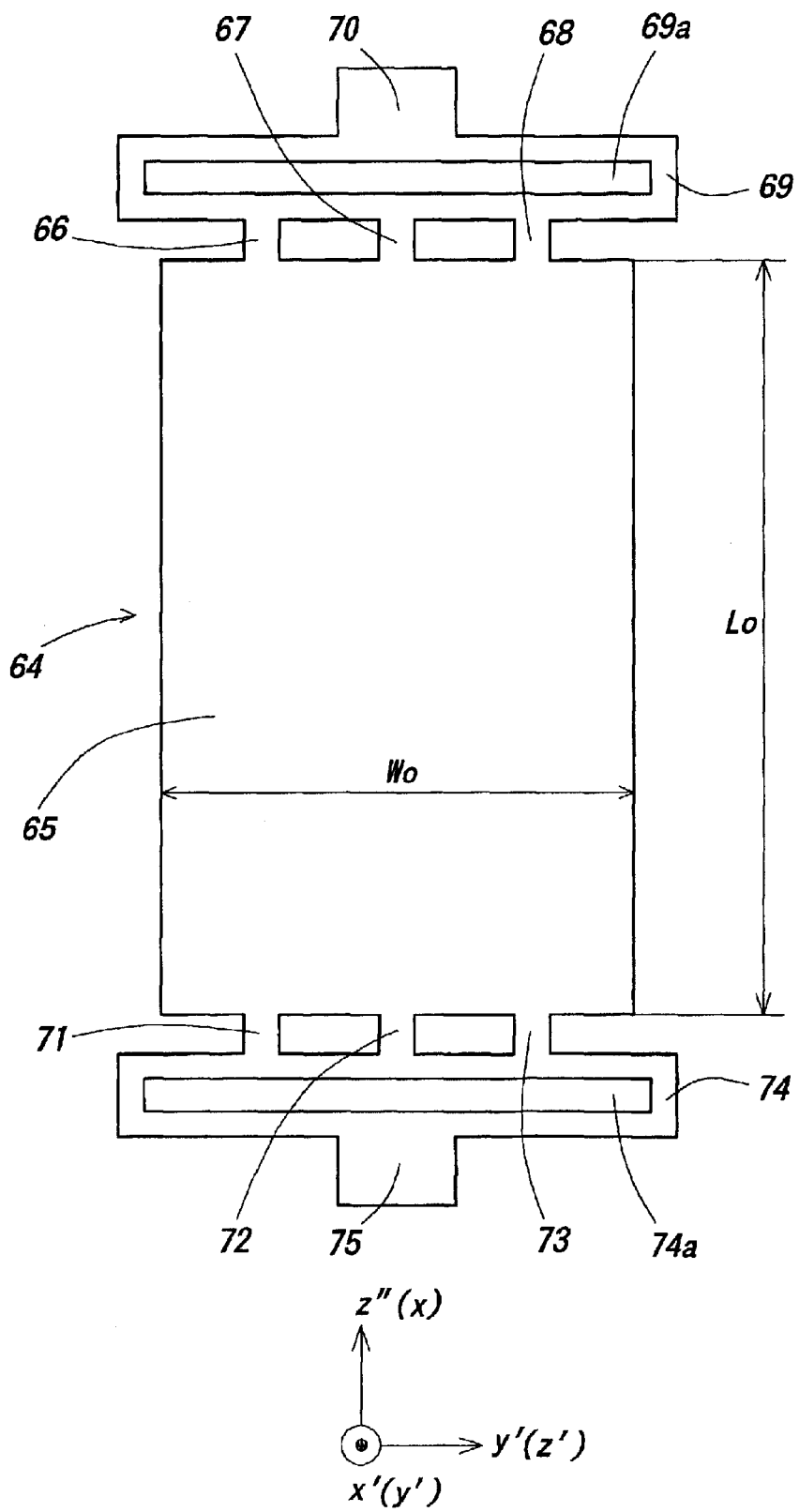
FIG. 9 is a plan view for the width-extensional mode piezoelectric crystal resonator of the sixth embodiment, according to the present invention.

FIG. 9 is a plan view for a width-extensional mode piezoelectric crystal resonator of the sixth embodiment of the present invention. The resonator 64 comprises vibrational portion 65, connecting portions, 66, 67, 68, 71, 72, 73 and supporting portions 69, 74 including respective mounting portions 70 and 75. The supporting portions 69 and 74 have respective holes 69a and 74a.

In this embodiment, a plurality of connecting portions 66, 67, 68 and a plurality of connecting portions 71, 72, 73 are connected to both ends of the length direction of the vibrational portion 65, moreover, the one connecting portions 66, 67, 68 and the other connecting portions 71, 72, 73 are connected to the respective supporting portions 69 and 74. The vibrational portion, the connecting portions and the supporting portions of said resonator are formed integratedly.

In addition, the vibrational portion for the resonator has a dimension of width $W_0$, length $L_0$ and thickness $T_0$ (not visible in FIG. 9), and also, though the electrodes to be disposed upon said resonator is not illustrated in FIG. 9, the electrode construction described in the first embodiment to the fifth embodiment can be also applied to this resonator.

In this embodiment, though three pieces of connecting portion are, respectively, constructed at both sides of the vibrational portion, the present invention also includes connecting portions more than the three pieces. It may be possible to construct connecting portions of the same number as that of the order of overtone theoretically, but, it is, actually, preferable to construct them fewer than the order of overtone.

Thus, as the width-extensional mode piezoelectric crystal resonator of the present invention has a plurality of connecting portions at both sides of the vibrational portion, respectively, the resonator is provided with a small series resistance $R_1$, a high quality factor Q and strength against shock, even if it is a resonator with thin thickness which gives high frequency. Also, x', y' and z" axes are for quartz crystal and x, y' and z' axes inside the bracket shown in FIG. 9 are for lithium tantalate and lithium niobate. The following embodiments also have the same axes as those described above.

Seventh Embodiment

Figure 10:
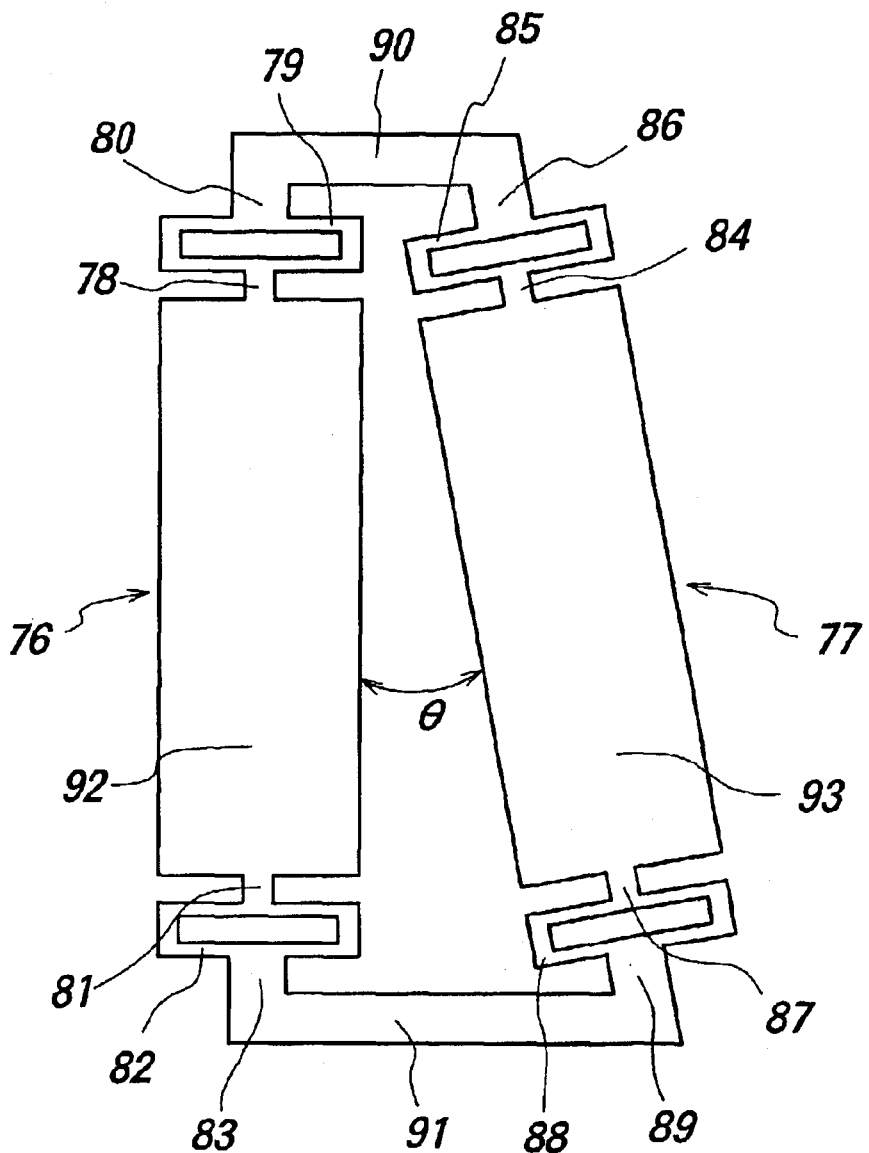
FIG. 10 is a plan view illustrating a shape of width-extensional mode piezoelectric crystal resonators of the seventh embodiment, according to the present invention.

FIG. 10 is a plan view illustrating a shape of width-extensional mode piezoelectric crystal resonators of the seventh embodiment, according to the present invention.

The one resonator 76 comprises vibrational portion 92, connecting portions 78, 81 and supporting portions 79, 82 including respective mounting portions 80 and 83, similarly, the other resonator 77 also comprises vibrational portion 93, connecting portions 84, 87 and supporting portions 85, 88 including respective mounting portions 86 and 89.

In addition, for the resonator in this embodiment, the mutual one mounting portions 80 and 86 of the two resonators 76 and 77 are connected through frame 90 and the mutual other mounting portions 83 and 89 are connected through frame 91. The resonators are formed integratedly with the angle θ of separation of 0° to 30°. The following embodiments also have the same angle as that described above.

Eighth Embodiment

FIG. 11 is a plan view illustrating a shape of width-extensional mode piezoelectric crystal resonators of the eighth embodiment, according to the present invention. In this embodiment, the vibrational portions 96 and 101 of the two resonators 94 and 95 are connected to frame 104 of the one supporting portion 99 through connecting portions 97 and 102, and similarly, are connected to frame 105 of the other supporting portion 100 through connecting portions 98 and 103. These resonators are also formed integratedly with the angle θ. The supporting portion 99 has the mounting portion 106 and a hole 99a, while the supporting portion 100 also has the mounting portion 107 and a hole 100a.

Ninth Embodiment

Figure 12:
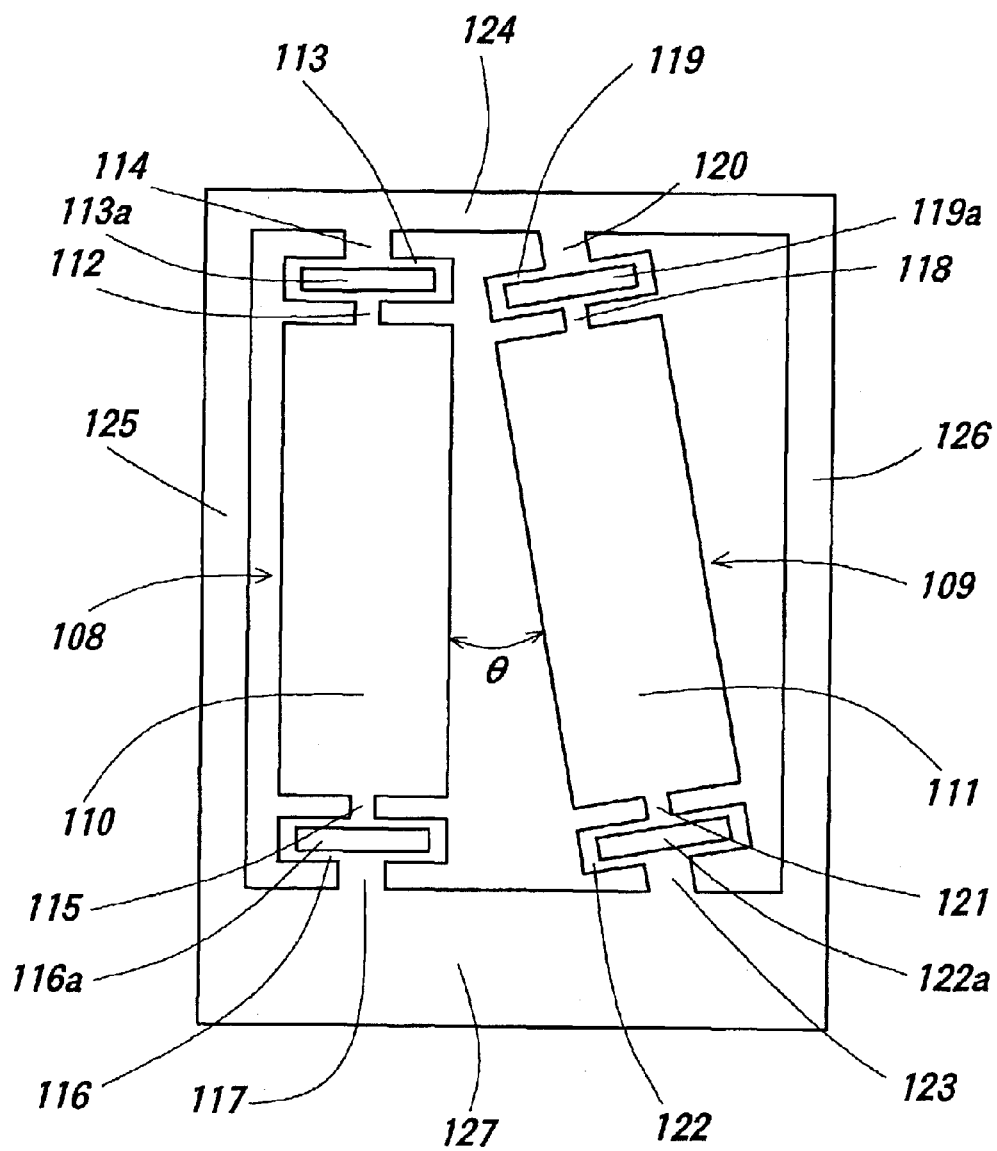
FIG. 12 is a plan view illustrating a shape of width-extensional mode piezoelectric crystal resonators of the ninth embodiment, according to the present invention.

FIG. 12 is a plan view illustrating a shape of width-extensional mode piezoelectric crystal resonators of the ninth embodiment, according to the present invention. The two resonators 108 and 109 are formed with the angle θ. The resonator 108 comprises vibrational portion 110, connecting portions 112, 115 and supporting portions 113, 116 including respective mounting portions 114 and 117. The supporting portions 113 and 116 have respective holes 113a and 116a. Similar to the resonator 108, the resonator 109 also comprises vibrational portion 111, connecting portions 118, 121 and supporting portions 119, 122 including respective mounting portions 120 and 123. The supporting portions 119 and 122 have respective holes 119a and 122a.

In addition, the one mounting portions 114 and 120 of the resonators 108 and 109 are connected through supporting frame 124, and the both end portions of the frame are connected to supporting frames 125 and 126 like surrounding the resonators 108 and 109. Furthermore, both end portions of the supporting frames 125 and 126 are connected to mounting portion 127. Also, the other mounting portions 117 and 123 are connected to the mounting portion 127.

Tenth Embodiment

FIG. 13 is a plan view illustrating a shape of width-extensional mode piezoelectric crystal resonators of the tenth embodiment, according to the present invention. Vibrational portion 142 of the resonator 128 is, respectively, connected to the supporting frame 138 and frame 132 through connecting portions 130 and 131, while vibrational portion 143 is, respectively, connected to the supporting frame 138 and frame 136 through connecting portions 134 and 135.

That is, the one end portions of both resonators are connected through the supporting frame 138. Moreover, the both end portions of the supporting frame 138 are, respectively, connected to supporting frames 139 and 140 like surrounding the both resonators 128 and 129, the both end portions of the supporting frames 139 and 140 are connected to mounting portion 141 which has two holes 133 and 137 to form the frames 132 and 136. Both resonators have the angle θ and the resonators with the shape in this embodiment are formed integratedly.

For the resonators of the seventh embodiment to the tenth embodiment, the two vibrational portions have the respective same dimensions (not shown in the figures). The present invention is, however, not limited to the above-mentioned embodiments, for example, when the vibrational portions of the two resonators have different dimensions, the both resonators have different frequency temperature behavior, eve if angle θ=0. Therefore, the present invention includes resonators with each different dimensions.

In addition, though the electrode construction is not illustrated for the resonators of the seventh embodiment (FIG. 10) to the tenth embodiment (FIG. 13), the electrode construction described in the first embodiment to the fifth embodiment can be, similarly, applied to these embodiments. Also, each resonator has, respectively, a piece of connecting portion at both end portions of the length direction of each vibrational portion for the resonators of the seventh embodiment to the tenth embodiment, but, the present invention is not limited to this and also includes the resonators with the respective plural pieces of connection portion at both end portions of the length direction of each vibrational portion.

Figure 14:
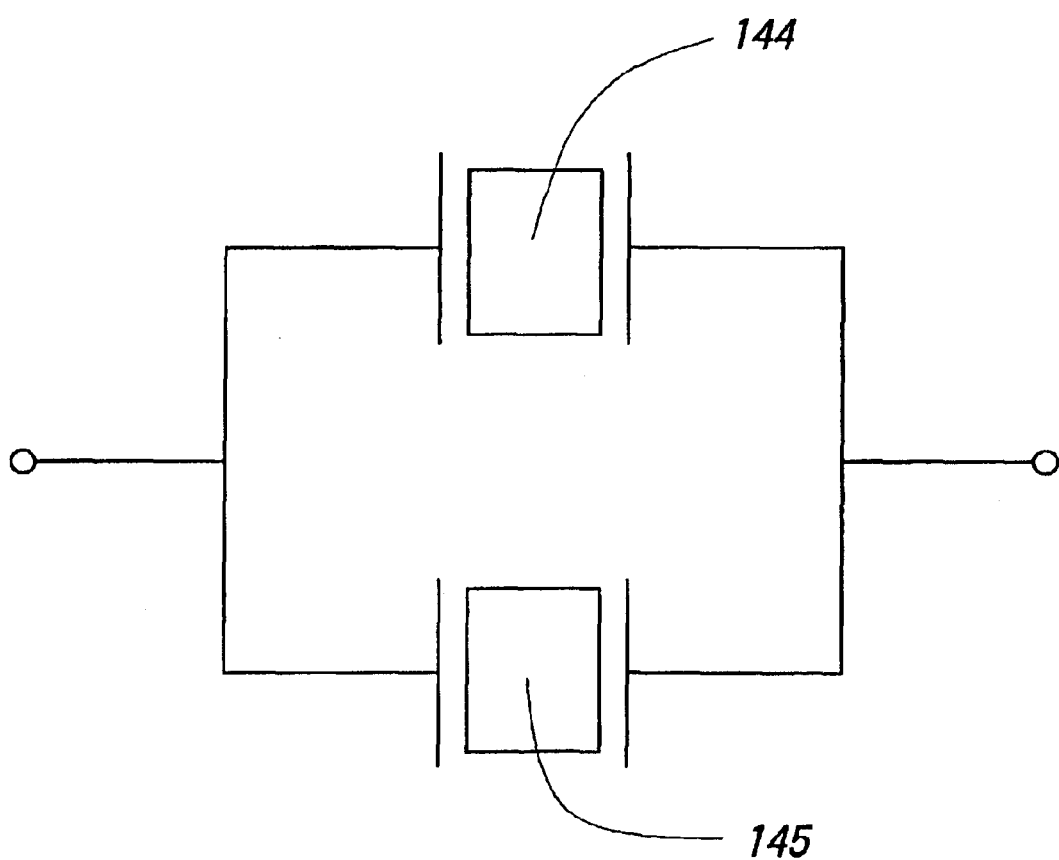
FIG. 14 is a diagram of electrical connection for width-extensional mode piezoelectric crystal resonators of FIGS. 10–13.

Moreover, by giving the angle θ between two width-extensional mode piezoelectric crystal resonators described in FIGS. 10–13, each resonator has different frequency temperature behavior. Accordingly, an improvement of frequency temperature behavior for the resonators can be performed by connecting these resonators in parallel electrically. At the same time, a series resistance $R_1$ can be also improved, for example, when each of two resonators has the same series resistance $R_1$, a combined series resistance $R_1'$ becomes half a value of $R_1$. Also, an electrical connection diagram of the both resonators is shown in FIG. 14.

Figure 15:
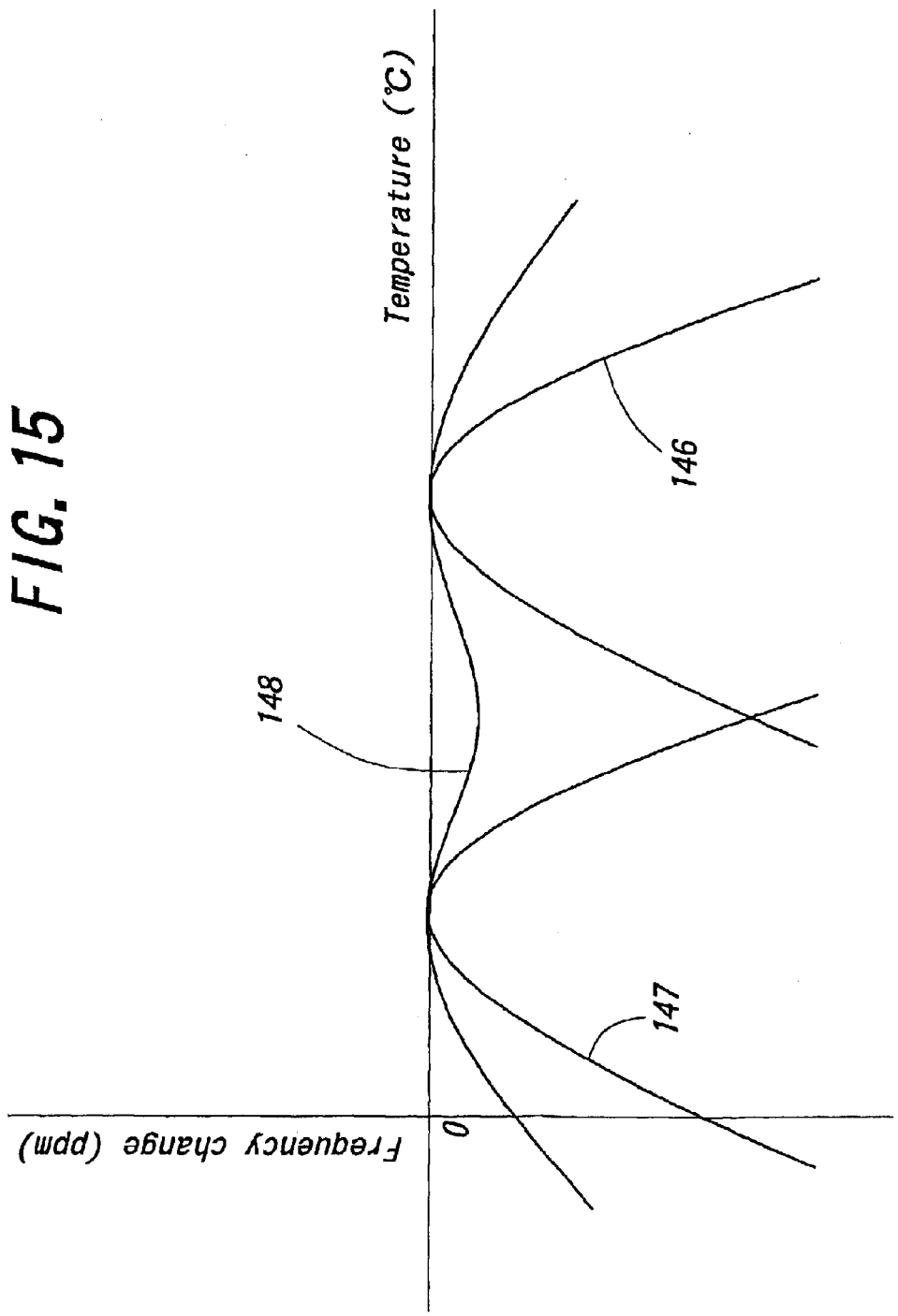
FIG. 15 is an example of frequency temperature behavior for the width-extensional mode piezoelectric crystal resonators of the embodiments illustrated in FIGS. 10–13, particularly, quartz crystal resonators.

FIG. 15 is an example of frequency temperature behavior for the width-extensional mode piezoelectric crystal resonators of the embodiments shown in FIGS. 10–13, particularly, for quartz crystal resonators. The two quartz crystal resonators have respective frequency temperature behavior illustrated by curves 146 and 147. The frequency temperature behavior of the compensated both quartz crystal resonators is illustrated by curve 148, by connecting them in parallel electrically. Like this, the width-extensional mode quartz crystal resonators in this embodiment can be provided with the excellent frequency temperature behavior, as shown by the curve 148. As a result of which, the width-extensional mode quartz crystal resonators miniaturized and excellent in frequency temperature behavior can be provided.

Figure 16:
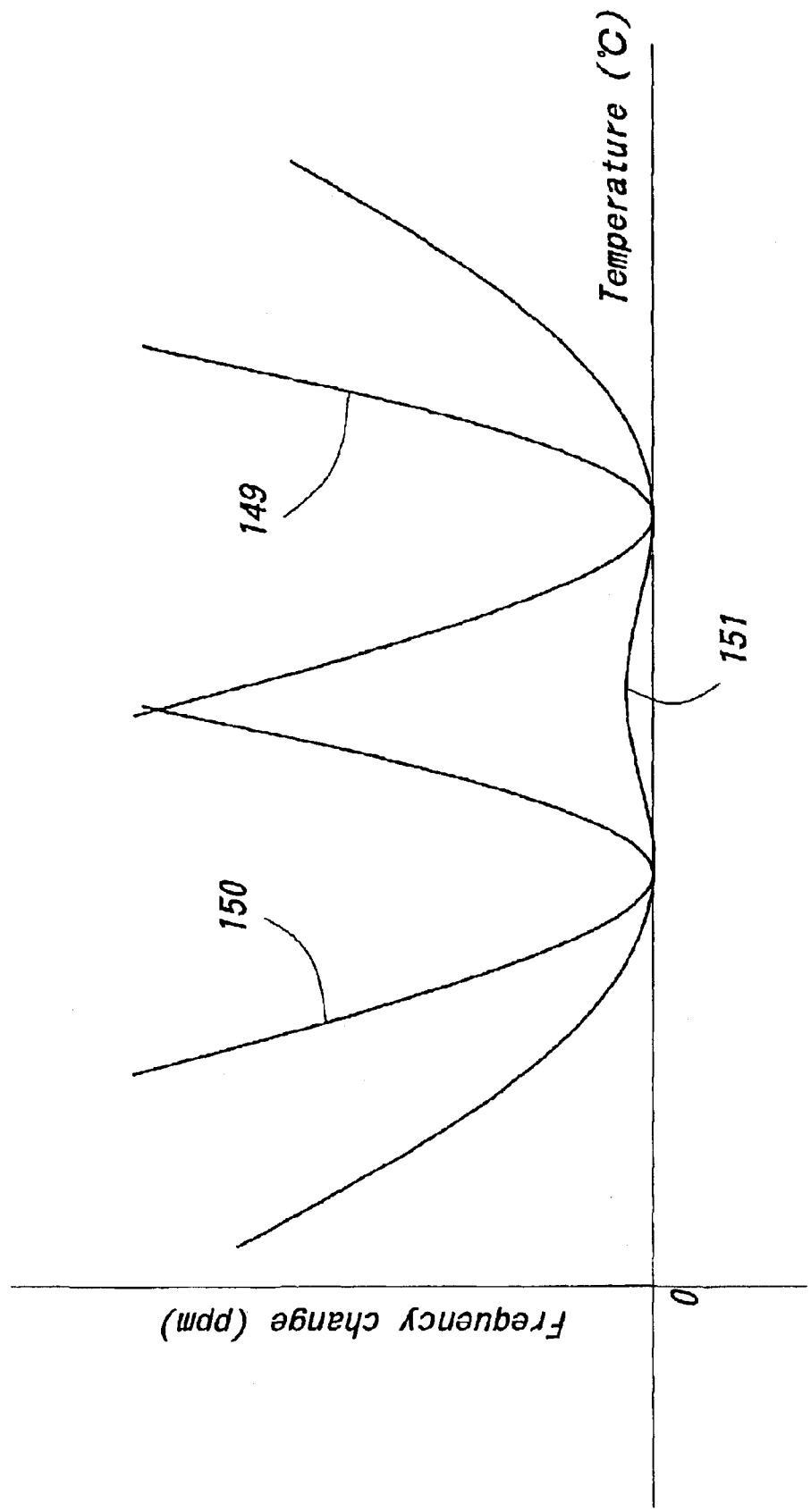
FIG. 16 is an example of frequency temperature behavior for the width-extensional mode piezoelectric crystal resonators of the embodiments illustrated in FIGS. 10–13, particular, lithium tantalate resonators.
Figure 17:
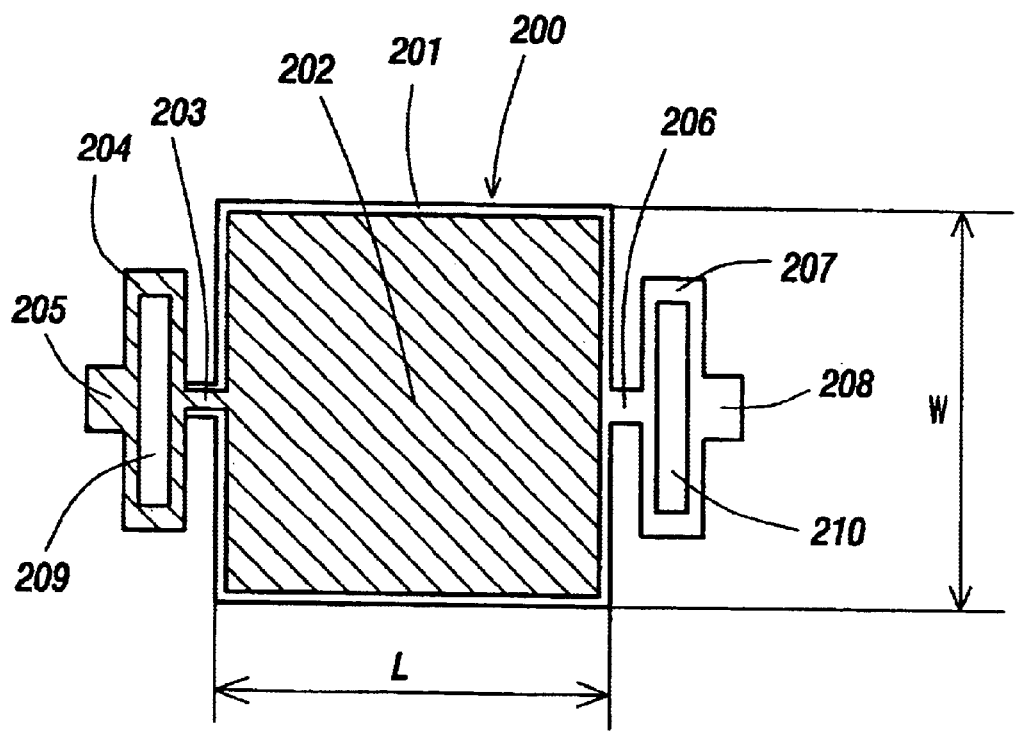
FIG. 17 is a plan view of the conventional NS-GT cut coupling quartz crystal resonator.
Figure 18:
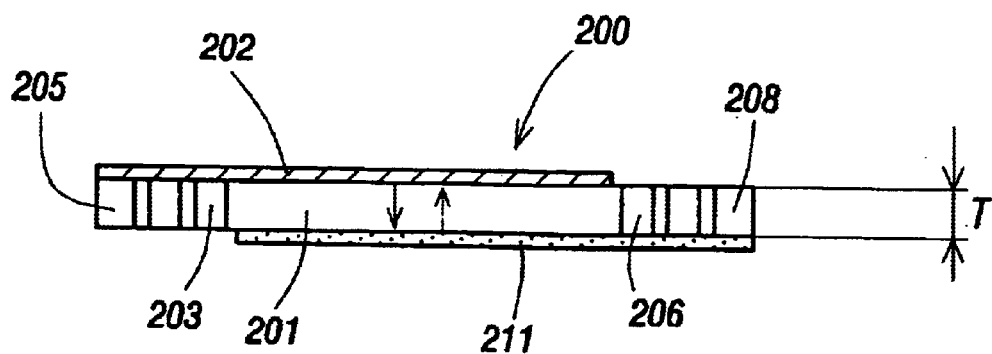
FIG. 18 is a side view of the conventional NS-GT cut coupling quartz crystal resonator.

FIG. 16 is an example of frequency temperature behavior for the width-extensional mode piezoelectric crystal resonators of the embodiments shown in FIGS. 10–13, particularly, for lithium tantalate resonators. The two resonators have frequency temperature behavior illustrated by the respective curves 149 and 150. The frequency temperature behavior of the compensated both lithium tantalate resonators is illustrated by curve 151, by connecting them in parallel electrically. Similar to the quartz crystal resonators, the width-extensional mode lithium tantalate resonators miniaturized and excellent in frequency temperature behavior can be also provided.

As described above, the width-extensional mode piezoelectric crystal resonators in said embodiments have such complicated shapes as comprise the vibrational portion, the connecting portions and the supporting portions. Also, when the resonators in said embodiments of the present invention are processed by a chemical etching method, the etching speed is extremely slow, so that it is very difficult and impossible to process the resonators by the chemical etching method. The resonators in the embodiments of the present invention are, therefore, processed by a physical or mechanical method, and said resonators are formed integratedly by the method.

Namely, particles with mass are collided with a piezoelectric crystal plate covered by resist corresponding to the shape of resonators by the physical or mechanical method, as a result of which, the shape of the resonators is processed because atoms or molecules of the piezoelectric crystal plate scatter. This method is called "particle method" here. This method is, substantially, different from the chemical etching method and simultaneously, it has a feature that the processing speed is also very fast.

According to this particle method, low priced piezoelectric crystal resonators can be provided because the processing time of outward shapes for the resonators shorten extremely. For this particle method, resist with elastic characteristics is used to prevent the resist from defacement by particles, as the resist, for example, plastic resist for use in blast processing is well known. Also, for this particle method, for example, it is preferable to use particles of GC#1000 to GC#6000 as the particles for use in processing.

Thus, the detailed description for the resonators of the present invention was performed, based upon the embodiments with the figures. But, this invention is not limited to the above-described embodiments, for example, for the width-extensional mode resonators of the seventh embodiment to the tenth embodiment, two kinds of resonators each of which has different characteristics, are formed integratedly, but, the present invention also includes more than three kinds of resonators formed integratedly with each different characteristics. Moreover, this invention is not limited to the width-extensional mode piezoelectric crystal resonator with a shape of the first embodiment (FIG. 2) to the third embodiment (FIG. 4) and the sixth embodiment (FIG. 9), but, the present invention also includes a width-extensional mode piezoelectric crystal resonator with any shape of supporting portions which are connected to a vibrational portion at the both end portions via connecting portions. In addition, the width-extensional mode piezoelectric crystal resonator of this invention is housed in a package with a case and a lid, which is called surface mounting type.

Furthermore, there are two kinds of resonators for a width-extensional mode: the one is a resonator of the transversal effect type and the other is a resonator of the longitudinal effect type. The resonator of the present invention belongs to the transversal effect type, in full detail, the resonator vibrates in the perpendicular direction versus the direction of electric field (thickness direction) and the resonance frequency is not dependent upon the piezoelectric constant at all which is important and necessary to drive it.

On the other hand, a resonator of the longitudinal effect type vibrates in the parallel direction versus the direction of electric field (width direction) and the resonant frequency is dependent upon the piezoelectric constant, for example, a KT cut width-extensional mode quartz crystal resonator belongs to this. But, the resonators of the present invention are principally different from the KT cut resonator. At the same time, it is needless to say that the quartz crystal resonators of the present invention are formed from the quartz crystal plate with the cut angle different from that of the KT cut quartz crystal resonator.

As described above, the outstanding effects are provided as follows; by providing the width-extensional mode piezoelectric crystal resonators with the resonator shapes, the electrode construction and the cut angles according to the present invention.

(1) As the piezoelectric constant which is of great importance and necessary to drive the width-extensional mode piezoelectric crystal resonator is extremely large, the electromechanical transformation efficiency becomes large, so that the miniature width-extensional mode piezoelectric crystal resonator can be provided with a small series resistance $R_1$ and a high quality factor Q.

(2) The electric field occurs perpendicular to the electrodes by disposing them with opposite electrical polarities on the upper and lower surfaces of the vibrational portion. As a result, the width-extensional mode piezoelectric crystal resonator is provided with a small series resistance $R_1$ because the electromechanical transformation efficiency becomes large. At the same time, a quality factor Q becomes high.

(3) As plural pairs of electrodes are disposed on the vibrational portion, the width-extensional mode piezoelectric crystal resonator with a high frequency and a small resistance R1 can be realized.

(4) The two width-extensional mode piezoelectric crystal resonators can be formed integratedly by the particle method, so that the miniature quartz crystal and lithium tantalate resonators can be provided with excellent frequency temperature behavior.

(5) The turn over temperature point $T_p$ can be changed arbitrarily by the selection of cut angle.

(6) As the width-extensional mode piezoelectric crystal resonator can be processed by the particle method, it is excellent in mass production, and also the low priced resonator can be provided because a large number of resonators can be formed in one wafer by the particle method at the same time.

(7) As the width-extensional mode piezoelectric crystal resonator comprises the vibrational portion, the connecting portions and the supporting portions, energy losses which are caused by supporting it on a pedestal and so forth decrease extremely, and the resonator with shockproof is provided.

(8) As plural pieces of width-extensional mode piezoelectric crystal resonators are formed integratedly and connected in parallel electrically, a combined series resistance $R_1'$ decrease. For example, for the two pieces of resonators with the same series resistance $R_1$, the combined resonator has approximately half a value of $R_1$. The combined resonator can be, therefore, obtained with a smaller series resistance by increasing the number of resonators to be combined.

(9) As plural pieces of width-extensional mode piezoelectric crystal resonators are formed integratedly and connected in parallel electrically, the function can be maintained as a resonator, even if one of the plural pieces of resonators is broken by some cause, for example by shock.

As described above, it will be easily understood that the width-extensional mode piezoelectric crystal resonator with novel shapes, novel electrode construction and novel cut angles according to the present invention may have the outstanding effects. In addition to this, as the present invention has been shown and described with reference to preferred embodiments thereof, it will be understood by those skilled in the art that the changes in shape and electrode construction can be made therein without departing from the spirit and scope of the present invention.

When a piezoelectric plate has thickness t, width w and length l, the expression by IEEE notation for a X plate quartz crystal first, rotated with an angle of θx of −20° to +20° about the x axis and second, rotated with an angle θy of −10° to +10° about the y' axis, according to the present invention is performed by xztw(−20°−+20°)/(−10°−+10°). Namely, xztw(θx)/(θy) implies that the first two crystal axes x, z show a relationship of thickness t and length l directions of a plate, and the last two dimensions t, w show angles rotated about the respective axes of the thickness and width directions, that is, the x and z axes directions must correspond to the thickness t and length l directions, respectively, and further, θx is an angle rotated about the axis of the thickness direction (x axis) and θy is an angle rotated about the axis of the width direction (y' axis). Therefore, θx and θy, in this case, show a cutting angle of the doubly rotated width-extensional mode quartz crystal resonator of this invention. Similarly, another cutting angles of the present invention can be expressed by xzwt(−10°−+10°)/(−20°−+20°) and yxl(+110−+150°), respectively.

What is claimed is:

1. A piezoelectric quartz crystal resonator comprising:
   a vibrational portion having a length greater than a width thereof and a thickness smaller than the width;
   a plurality of connecting portions each integrally connected to respective end portions of the vibrational portion;
   a plurality of support portions integrally connected to the vibrational portion through the connecting portions; and
   a plurality of electrodes disposed opposite each other on upper and lower surfaces of the vibrational portion;
   wherein the piezoelectric quartz crystal resonator vibrates in a width-extensional mode and has a cutting angle in the range of one of xztw(−20° to +20°)/(−10° to +10°) and xzwt(−10° to +10°)/(−20° to +20°).

2. A piezoelectric quartz crystal resonator according to claim 1; wherein the plurality of electrodes comprise at least one pair of electrodes each disposed on a respective one of the upper and lower surfaces of the vibrational portion in a direction perpendicular to the thickness direction thereof.

3. A piezoelectric quartz crystal resonator according to claim 2; further comprising a case for housing the piezoelectric quartz crystal resonator and a lid for covering an open end of the case.

4. A piezoelectric quartz crystal resonator according to claim 3; wherein a width-to-length ratio of the vibrational portion is smaller than 0.7 and a thickness-to-width ratio of the vibrational portion is smaller than 0.85.

5. A piezoelectric quartz crystal resonator according to claim 1; wherein the plurality of electrodes comprise an odd number of electrode pairs for vibration of the piezoelectric quartz crystal resonator in a symmetric mode and an even number of electrode pairs for vibration of the piezoelectric quartz crystal resonator in an asymmetric mode.

6. A piezoelectric quartz crystal resonator comprising:
   a vibrational portion having a length greater than a width thereof and a thickness smaller than the width;
   a plurality of connecting portions integrally connected to respective end portions of the vibrational portion;
   a plurality of support portions integrally connected to the vibrational portion through the connecting portions; and
   a plurality of electrodes disposed on upper and lower surfaces of the vibrational portion;
   wherein the piezoelectric quartz crystal resonator vibrates in a transversal resonator mode corresponding to a direction perpendicular to an electric field in the thickness direction of the piezoelectric quartz crystal resonator and vibrates in a width-extensional mode and has a piezoelectric constant $e_{12}$ of 0.123 C/m$^2$ to 0.18 C/m$^2$ in the absolute value.

7. A piezoelectric quartz crystal resonator according to claim 6; wherein the piezoelectric quartz crystal resonator has a cutting angle in the range of xztw(−20° to +20°)/(−10° to +10°).

8. A piezoelectric quartz crystal resonator according to claim 6; wherein the piezoelectric quartz crystal resonator has a cutting angle in the range of xzwt(−10° to +10°)/(−20° to +20°).

9. A piezoelectric quartz crystal resonator according to claim 6; further comprising a case for housing the piezoelectric quartz crystal resonator and a lid for covering an open end of the case.

10. A piezoelectric quartz crystal resonator according to claim 6; wherein the piezoelectric quartz crystal resonator comprises a plurality of individual resonators integrated into a single piezoelectric quartz crystal resonator through at least one supporting frame.

11. A piezoelectric crystal resonator comprising:
    a vibrational portion having a length greater than a width thereof and a thickness smaller than the width;
    a plurality of connecting portions each integrally connected to respective end portions of the vibrational portion;
    a plurality of support portions integrally connected to the vibrational portion through the connecting portions; and
    a plurality of electrodes disposed on upper and lower surfaces of the vibrational portion;
    wherein the piezoelectric crystal resonator vibrates in a transversal resonator mode corresponding to a direction perpendicular to an electric field in the thickness direction of the piezoelectric crystal resonator and in a width-extensional mode; and
    wherein the piezoelectric crystal resonator is made of lithium tantalate and has a piezoelectric constant $e_{23}$ of 1.22 C/m$^2$ to 3.04 C/m$^2$ in the absolute value.

12. A piezoelectric crystal resonator according to claim 11; wherein the piezoelectric crystal resonator has a cutting angle in the range of yxl(+110° to +150°).

13. A piezoelectric crystal resonator according to claim 11; further comprising a case for housing the piezoelectric crystal resonator and a lid for covering an open end of the case.

14. A piezoelectric crystal resonator according to claim 11; wherein the piezoelectric crystal resonator comprises a plurality of individual resonators integrated into a single piezoelectric crystal resonator through at least one supporting frame.

15. A method of manufacturing a piezoelectric crystal resonator, comprising the step of: utilizing a mechanical particle method to form a piezoelectric quartz crystal resonator having a vibrational portion having a length greater than a width thereof and a thickness smaller than the width, a plurality of connecting portions each integrally connected to respective end portions of the vibrational portion, a plurality of support portions integrally connected to the vibrational portion through the connecting portions, and a plurality of electrodes disposed opposite each other on upper and lower surfaces of the vibrational portion so that the piezoelectric quartz crystal resonator vibrates in a width-extensional mode and has a cutting angle in the range of xztw(−20° to +20°)/(−10° to +10°).

16. A method according to claim 15; wherein the utilizing step includes the step of forming the vibrational portion with a thickness-to-width ratio smaller than 0.85 and a width-to-length ratio smaller than 0.7.

17. A method according to claim 15; wherein the utilizing step includes the step of forming the vibrational portion with a thickness-to-width ratio smaller than 0.85/n and a width-to-length ratio smaller than 0.7n when the piezoelectric quartz crystal resonator is required to vibrate in a symmetric mode, where n represents an odd number of electrodes.

18. A method according to claim 15; wherein the utilizing step includes the step of forming the vibrational portion with a thickness-to-width ratio smaller than 0.85/m and a width-to-length ratio smaller than 0.7m when the piezoelectric quartz crystal resonator is required to vibrate in an asymmetric mode, where m represents an even number of electrodes.

19. A method according to claim 15; wherein the utilizing step includes the step of forming two connecting portions when the piezoelectric quartz crystal resonator is required to vibrate in a fundamental mode of vibration.

20. A method according to 15; wherein the utilizing step includes the step of forming the connecting portions fewer in number than an order of an overtone mode of the piezoelectric quartz crystal resonator.

21. A method according to claim 15; wherein the utilizing step includes the step of forming a plurality of the piezoelectric quartz crystal resonators and integrating the piezoelectric quartz crystal resonators into a single piezoelectric quartz crystal resonator through at least one supporting frame.

22. A method according to 21; wherein the integrating step comprises arranging the piezoelectric quartz crystal resonators with an angle of separation of 0° to 30°.

23. A method according to 21; wherein the integrating step comprises electrically connecting the piezoelectric quartz crystal in parallel.

24. A method according to 21; wherein the utilizing step includes the step of forming each of the piezoelectric quartz crystal resonators with a different shape.

25. A method according to claim 15; wherein the mechanical particle method includes the step of colliding a piezoelectric quartz crystal plate with particles having a preselected mass.

26. A piezoelectric crystal resonator dimensioned and configured to undergo vibration in a width-extensional mode and having a cutting angle in the range of xztw(−20° to +20°)/(−10° to +10°).

27. A piezoelectric crystal resonator according to claim 26; wherein the piezoelectric crystal resonator comprises a quartz crystal resonator.

28. A piezoelectric crystal resonator according to claim 26; wherein the piezoelectric crystal resonator comprises a lithium tantalate resonator.

29. A piezoelectric crystal resonator dimensioned and configured to undergo vibration in a width-extensional mode and having a cutting angle in the range of xzwt(−10° to +10°)/(−20° to +20°).

30. A piezoelectric crystal resonator according to claim 29; wherein the piezoelectric crystal resonator comprises a quartz crystal resonator.

31. A piezoelectric crystal resonator according to claim 29; wherein the piezoelectric crystal resonator comprises a lithium tantalate resonator.

* * * * *